United States Patent
Zhang et al.

(10) Patent No.: US 11,204,321 B2
(45) Date of Patent: Dec. 21, 2021

(54) HUMIDITY SENSOR

(71) Applicant: Alliance for Sustainable Energy, LLC, Golden, CO (US)

(72) Inventors: Hanyu Zhang, Indianapolis, IN (US); Elisa M. Link, Denver, CO (US)

(73) Assignee: Alliance for Sustainable Energy, LLC, Golden, CO (US)

( * ) Notice: Subject to any disclaimer, the term of this patent is extended or adjusted under 35 U.S.C. 154(b) by 0 days.

(21) Appl. No.: 17/000,469

(22) Filed: Aug. 24, 2020

(65) Prior Publication Data
US 2021/0055220 A1   Feb. 25, 2021

Related U.S. Application Data

(60) Provisional application No. 62/890,167, filed on Aug. 22, 2019.

(51) Int. Cl.
*G01N 21/64* (2006.01)
*C23C 16/30* (2006.01)
*C23C 16/56* (2006.01)

(52) U.S. Cl.
CPC .......... *G01N 21/64* (2013.01); *C23C 16/305* (2013.01); *C23C 16/56* (2013.01); *G01N 2201/062* (2013.01); *G01N 2201/06113* (2013.01)

(58) Field of Classification Search
CPC ... G01N 2201/062; G01N 2201/06113; G01N 21/64; C23C 16/305; C23C 16/56
See application file for complete search history.

(56) References Cited

U.S. PATENT DOCUMENTS

| | | | | |
|---|---|---|---|---|
| 10,319,588 B2* | 6/2019 | Mattinen | ............... | H01L 29/742 |
| 2006/0034729 A1* | 2/2006 | Poponin | ................. | G02B 5/204 |
| | | | | 422/82.05 |
| 2012/0062896 A1* | 3/2012 | Familia | ..................... | G01J 3/42 |
| | | | | 356/437 |
| 2015/0118487 A1* | 4/2015 | Wolden | ................. | G02B 1/002 |
| | | | | 428/336 |
| 2019/0338416 A1* | 11/2019 | Kong | ............... | C23C 16/45512 |

OTHER PUBLICATIONS

Ahn, J-H. et al., "Ambient effects on electrical characteristics of CVD-grown monolayer MoS2 field-effect transistors," Scientific Reports, Jun. 2017, 9 pages.

Ascorbe, J. et al., "Recent Developments in Fiber Optics Humidity Sensors," Sensors, vol. 17, 893, 2017, 23 pages.

(Continued)

*Primary Examiner* — David P Porta
*Assistant Examiner* — Fani Boosalis
(74) *Attorney, Agent, or Firm* — Michael A. McIntyre

(57) ABSTRACT

The present disclosure relates to a device that includes a light source, a detector; and a film having a first surface that includes a transition metal dichalcogenide, where the film is configured to interact with a volume of gas containing a concentration of water vapor, the light source is configured to shine a first light onto the first surface, the film is configured, as a result of the first light, to emit from the first surface a second light, the detector is configured to receive at least a portion of the second light, and the detector is configured to generate a signal proportional to an intensity of the second light.

19 Claims, 22 Drawing Sheets

(56) References Cited

OTHER PUBLICATIONS

Atkin, P. et al., "Laser exposure induced alteration of WS2 monolayers in the presence of ambient moisture," 2d Materials, vol. 5, 2018, 11 pages.
Bera, A. et al., "Enhanced Raman and Photoluminescence response in monolayer MoS2 due to laser healing of defects," Journal of Raman Spectroscopy, Jul. 2017, DOI: 10.1002/jrs.5196, 6 pages.
Guo, H. et al., "Transparent, flexible, and stretchable WS2 based humidity sensors for electronic skin," Nanoscale Communication, vol. 9, 2017, 8 pages.
Gutierrez, H.R. et al., "Extraordinary Room Temperature Photoluminescence in Triangular WS2 Monolayers," Nano Letters, vol. 13, 2013, 8 pages.
Hu, P. et al., "Control of Radiative Exciton Recombination by Charge Transfer Induced Surface Dipoles in MoS2 and WS2 Monolayers," Scientific Reports, Apr. 2016, 10 pages.
Huang, X. et al., "Quantitative Analysis of Temperature Dependence of Raman shift of monolayer WS2," Scientific Reports, 2016, 8 pages.
Islam, M. A. et al., "Three dimensionally-ordered 2D MoS2 vertical layers integrated on flexible substrates with stretch-tunable functionality and improved sensing capability," Nanoscale Communication, vol. 10, 2018, 9 pages.
Jha, R. et al., "Humidity Sensing Properties of Coexfoliated Heterogeneous WS2/WSe2 Nanohybrids," IEEE Transactions on Nanotechnology, vol. 17, No. 3, May 2018, 8 pages.
Kim, M.S. et al., "Biexciton Emission from Edges and Grain Boundaries of Triangular WS2 Monolayers," ACS Nano, vol. 10, 2016, 7 pages.
Lee, Y. et al., "Large Work Function Modulation of Monolayer MoS2 by Ambient Gases," ACS Nano, vol. 10, 2016, 8 pages.
Lee, Y. et al., "Impeding Exciton-Exciton Annihilation in Monolayer WS2 by Laser Irradiation," ACS Photonics, vol. 5, 2018, 8 pages.
Lin, Y. et al., "Dielectric Screening of Excitons and Trions in Single Layer MoS2," Nano Letters, vol. 14, 2014, 8 pages.
Luo, Y. et al., "Tungsten disulfide (WS2) based all-fiber-optic humidity sensor," Optics Express 8956, vol. 24, No. 8, 2016, 11 pages.
Nan, H. et al., "Strong Photoluminescence Enhancement of MoS2 through Defect Engineering and Oxygen Bonding," vol. 8, No. 6, 2014, 8 pages.
Oh, H.M. et al., "Photochemical Reaction in Monolayer MoS2 via Correlated Photoluminescence, Raman Spectroscopy, and Atomic Force Microscopy," ACS Nano, vol. 10, 2016, 7 pages.
Park, W. et al., "Oxygen environmental and passivation effects on molybdenum disulfide field effect transistors," Nanotechnology, vol. 24, 2013, 5 pages.
Pawbake, A. et al., "Highly Transparent Wafer-Scale Synthesis of Crystalline WS2 Nanoparticle Thin Film for Photodetector and Humidity-Sensing Applications," Applied Materials & Interfaces, vol. 8, 2016, 7 pages.
Pham, T. et al., "MoS2-Based Optoelectronic Gas Sensor with Sub-parts-per-billion Limit of NO2 Gas Detection," ACS Nano, vol. 13, 2019, 10 pages.
Peimyoo, N. et al., "Chemically Driven Tunable Light Emission of Charged and Neutral Excitons in Monolayer WS2," ACS Nano, vol. 8, No. 11, 2014, 10 pages.
Peimyoo, N. et al., "Thermal conductivity determination of suspended mono- and bilayer WS2 by Raman spectroscopy," Nano Research, vol. 8, No. 4, 2015, 12 pages.
Peto, J. et al., "Spontaneous doping of the basal plane of MoS2 single layers through oxygen substitution under ambient conditions," Nature Chemistry, vol. 10, 2018, 6 pages.
Qin, Z. et al., "Effect of layer number on recovery rate of WS2 nanosheets for ammonia detection at room temperature," Applied Surface Science, vol. 414, 2017, 7 pages.
Shang, J. et al. "Observation of Excitonic Fine Structure in a 2D Transition-Metal Dichalcogenide Semiconductor," ACS Nano, vol. 9, No. 1, 2015, 9 pages.
Sharma, S. et al., "Size-tunable photoluminescence from WS2 nanostructures," Materials Research Express, vol. 5, 2018, 9 pages.
Tongay, S. et al., "Broad-Range Modulation of Light Emission in Two-Dimensional Semiconductors by Molecular Physisorption Gating," Nano Letters, vol. 13, 2013, 6 pages.
Venkatakrishnan, A. et al., "Microsteganography on WS2 Monolayers Tailored by Direct Laser Painting," ACS Nano, vol. 11, 2017, 8 pages.
Wang, X.H. et al., "Photoinduced doping and photoluminescence signature in an exfoliated WS2 monolayer semiconductor," RSC Advances, vol. 6, 2016, 5 pages.
Yun, S-J. et al., "Telluriding monolayer MoS2 and WS2 via alkali metal scooter," Nature Communications, vol. 8:2163, DOI: 10.1038/S41467-017-02238-0, 10 pages.
Zhang, F. et al., "Carbon doping of WS2 monolayers: Bandgap reduction and p-type doping transport," Science Advances, vol. 5, 2019, 8 pages.
Zhang, Q. et al., "Reliable Synthesis of Large-Area Monolayher WS2 Single Crystals, Films, and Heterostructures with Extraordinary Photoluminescence Induced by Water Intercalation," Advanced Optical Materials, vol. 6, 2018, 9 pages.

\* cited by examiner

HUMIDITY SENSOR

CROSS-REFERENCE TO RELATED APPLICATIONS

This application claims priority from U.S. Provisional Patent Application No. 62/890,167, filed on Aug. 22, 2019, the contents of which are incorporated herein by reference in its entirety.

CONTRACTUAL ORIGIN

This invention was made with government support under Contract No. DE-AC36-08GO28308 awarded by the Department of Energy. The government has certain rights in the invention.

SUMMARY

An aspect of the present disclosure is a device that includes a light source, a detector; and a film having a first surface that includes a transition metal dichalcogenide, where the film is configured to interact with a volume of gas containing a concentration of water vapor, the light source is configured to shine a first light onto the first surface, the film is configured, as a result of the first light, to emit from the first surface a second light, the detector is configured to receive at least a portion of the second light, and the detector is configured to generate a signal proportional to an intensity of the second light.

In some embodiments of the present disclosure, the light source may include at least one of a light-emitting diode and/or a laser. In some embodiments of the present disclosure, the first light may have a wavelength between about 400 nm and about 650 nm. In some embodiments of the present disclosure, the first light may have a wavelength between about 515 nm and about 545 nm. In some embodiments of the present disclosure, the light source may be configured to provide a power between about 0.1 µW and about 10,000 µW. In some embodiments of the present disclosure, the second light may have a wavelength between about 400 nm and about 1050 nm. In some embodiments of the present disclosure, the detector may be configured to detect visible light. In some embodiments of the present disclosure, the detector may include a silicon charge-coupled device. In some embodiments of the present disclosure, the film may have a thickness between about 0.1 nm and about 10.0 nm.

In some embodiments of the present disclosure, the transition metal dichalcogenide may include tungsten disulfide. In some embodiments of the present disclosure, the transition metal dichalcogenide may include at least one of tungsten disulfide, tungsten diselenide, tungsten ditelluride, molybdenum disulfide, hafnium disulfide, iridium disulfide, manganese diselenide, molybdenum diselenide, molybdenum ditelluride, niobium diselenide, niobium disulfide, platinum diselenide, platinum disulfide, rhenium diselenide, rhenium disulfide, rhenium ditelluride, zirconium disulfide, titanium(IV) sulfide, titanium disulfide, tungsten diselenide, tungsten ditelluride, hafnium diselenide, vanadium disulfide, and/or vanadium diselenide.

An aspect of the present disclosure is a system that includes a processor, a device that includes a light source, a detector, and a film having a first surface that includes a transition metal dichalcogenide, where the film is configured to interact with a volume of gas containing a concentration of water vapor, the light source is configured to shine a first light onto the first surface, the film is configured, as a result of the first light, to emit from the first surface a second light, the detector is configured to receive at least a portion of the second light, the detector is configured to generate a signal proportional to an intensity of the second light, the processor is configured to receive the signal, and the processor includes an algorithm that converts the signal to a variable that is proportional to the concentration of water vapor.

In some embodiments of the present disclosure, the signal may include a power intensity of the second light. In some embodiments of the present disclosure, the variable may include an integrated area of at least one of a photoluminescence intensity of an exciton ($X^0$), a photoluminescence intensity of a trion ($X^-$), and/or a photoluminescence intensity lower energy state (LES). In some embodiments of the present disclosure, the algorithm may include a plot of relative humidity versus an integrated area of at least one of a photoluminescence intensity of an exciton ($X^0$), a photoluminescence intensity of a trion ($X^-$), and/or a photoluminescence intensity lower energy state (LES).

An aspect of the present disclosure is a method that includes exposing a film having a surface that includes a transition metal dichalcogenide to a volume of gas containing a concentration of water vapor, directing a first light to the surface, resulting in the forming of a second light by the surface photoluminescing, where the second light includes at least two wavelengths, during the directing, measuring the intensity of each wavelength, calculating from the spectral area, at least one Gaussian component, and correlating the Gaussian component to the concentration of water vapor.

In some embodiments of the present disclosure, the Gaussian component may include at least one of a photoluminescence intensity of an exciton ($X^0$), a photoluminescence intensity of a trion ($X^-$), and/or a photoluminescence intensity lower energy state (LES). In some embodiments of the present disclosure, the correlating may include creating a calibration plot of a relative humidity versus an integrated area of at least one of a photoluminescence intensity of an exciton ($X^0$), a photoluminescence intensity of a trion ($X^-$), and/or a photoluminescence intensity lower energy state (LES). In some embodiments of the present disclosure, the integrated area may be completed for a time period between 1 second and 1000 seconds. In some embodiments of the present disclosure, the method may further include an annealing of the film in an inert atmosphere at a temperature between about 100° C. and about 300° C.

BRIEF DESCRIPTION OF DRAWINGS

Some embodiments are illustrated in referenced figures of the drawings. It is intended that the embodiments and figures disclosed herein are to be considered illustrative rather than limiting.

REFERENCE NUMBERS

Figure 1:
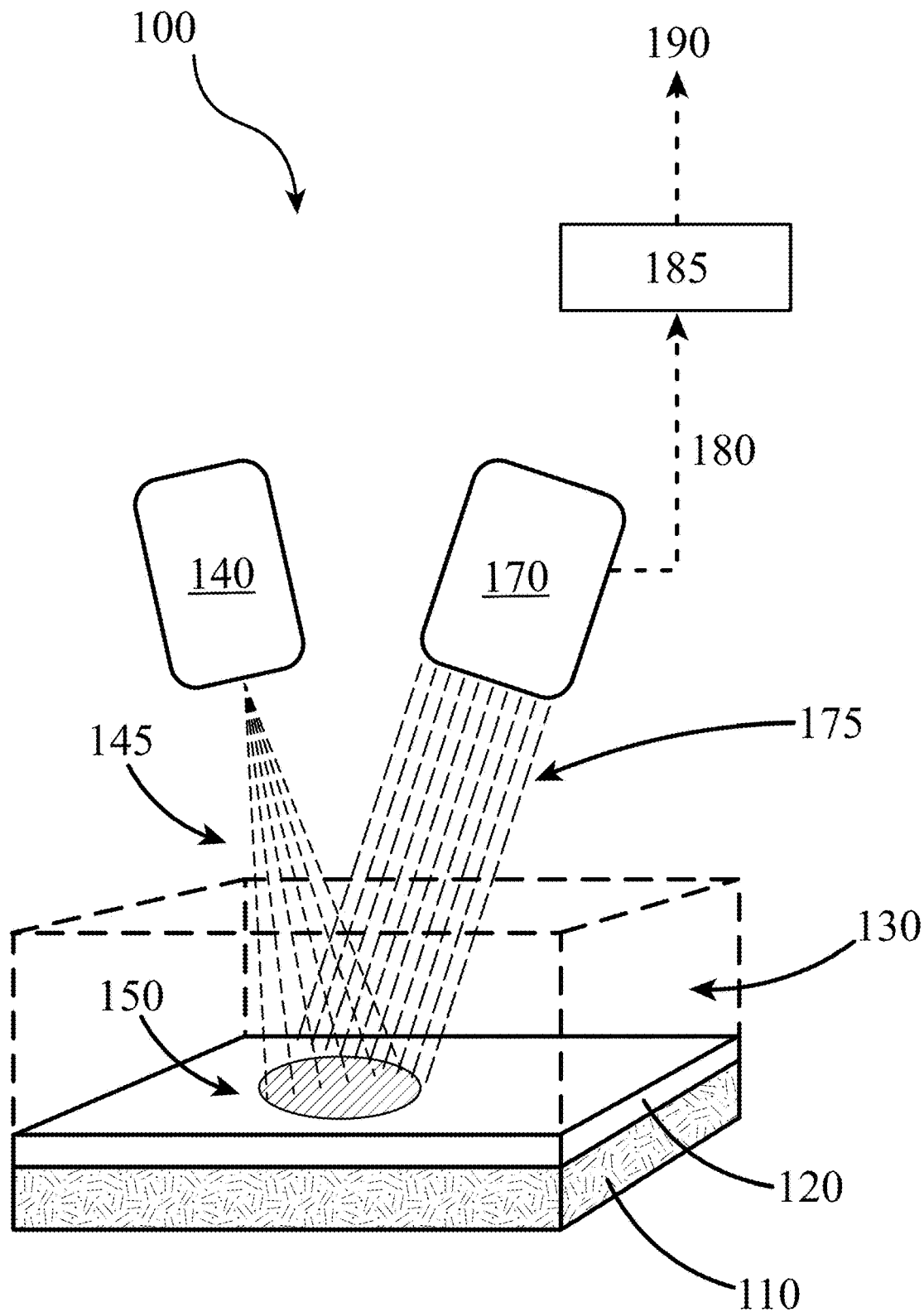
FIG. 1 illustrates a device for measuring humidity, according to some embodiments of the present disclosure.

100 . . . device
110 . . . substrate
120 . . . film
130 . . . volume of gas
140 . . . light source
145 . . . first light
150 . . . portion illuminated and/or emitting
170 . . . detector
175 . . . second light
180 . . . signal
185 . . . processor
190 . . . output
200 . . . method
210 . . . exposing
220 . . . directing
230 . . . varying
240 . . . measuring
250 . . . correlating
300 . . . method
310 . . . estimating
320 . . . calculating a factor
330 . . . creating
340 . . . extracting
350 . . . calculating humidity

DETAILED DESCRIPTION

The present disclosure may address one or more of the problems and deficiencies of the prior art discussed above. However, it is contemplated that some embodiments as disclosed herein may prove useful in addressing other problems and deficiencies in a number of technical areas. Therefore, the embodiments described herein should not necessarily be construed as limited to addressing any of the particular problems or deficiencies discussed herein.

References in the specification to "one embodiment", "an embodiment", "an example embodiment", "some embodiments", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

As used herein the term "substantially" is used to indicate that exact values are not necessarily attainable. By way of example, one of ordinary skill in the art will understand that in some chemical reactions 100% conversion of a reactant is possible, yet unlikely. Most of a reactant may be converted to a product and conversion of the reactant may asymptotically approach 100% conversion. So, although from a practical perspective 100% of the reactant is converted, from a technical perspective, a small and sometimes difficult to define amount remains. For this example of a chemical reactant, that amount may be relatively easily defined by the detection limits of the instrument used to test for it. However, in many cases, this amount may not be easily defined, hence the use of the term "substantially". In some embodiments of the present invention, the term "substantially" is defined as approaching a specific numeric value or target to within 20%, 15%, 10%, 5%, or within 1% of the value or target. In further embodiments of the present invention, the term "substantially" is defined as approaching a specific numeric value or target to within 1%, 0.9%, 0.8%, 0.7%, 0.6%, 0.5%, 0.4%, 0.3%, 0.2%, or 0.1% of the value or target.

As used herein, the term "about" is used to indicate that exact values are not necessarily attainable. Therefore, the term "about" is used to indicate this uncertainty limit. In some embodiments of the present invention, the term "about" is used to indicate an uncertainty limit of less than or equal to ±20%, ±15%, ±10%, ±5%, or ±1% of a specific numeric value or target. In some embodiments of the present invention, the term "about" is used to indicate an uncertainty limit of less than or equal to ±1%, ±0.9%, ±0.8%, ±0.7%, ±0.6%, ±0.5%, ±0.4%, ±0.3%, ±0.2%, or ±0.1% of a specific numeric value or target.

The present disclosure relates to unique humidity sensors that utilize changes to the optoelectronic properties of two-dimensional transition metal dichalcogenide (TMDC) surfaces as a result of interactions between the TMDC surfaces with humid air and/or light. TMDCs have the formula $MX_2$, where M=Mo and/or W and X=S, Se, and/or Te. As shown herein, using TMDCs constructed of $WS_2$ and/or $MoS_2$ monolayers, the photoluminescence (PL) of these monolayers change with the relative humidity (ratio of $H_2O$ vapor partial pressure to saturated $H_2O$ vapor pressure) and 532 nm light irradiation, thus illustrating the feasibility of TMDCs as sensitive humidity detectors. For example, as shown herein, exposure of $WS_2$ monolayers to 40% humidity and 532 nm light irradiation, the $WS_2$ photoluminescence (PL) peak center is redshifted, while the overall augment of PL intensity is dominated by the trion (one component of the PL) enhancement. Whereas, at 80% humidity, the $WS_2$ PL peak center is essentially not shifted while experiencing an overall intensity increase. Thus, as shown herein, measuring the change to the PL upon exposure to air, the measured PL intensity, peak position, and shape can be used to quantify the relative humidity of a gas environment.

In some embodiments of the present disclosure, a humidity sensor may employ an indirect detecting system utilizing a PL measurement setup and at least one two-dimensional (2D) TMDC, where the active area for the TMDC may be less than 1-micron. The PL measurement reading of the 2D TMDCs may determine the relative humidity. Thus, 2D TMDCs may be embedded anywhere with an optical window, ensuring a very compact optical sensor compared to currently available devices. In some embodiments of the present disclosure, a 2D TMDC-containing humidity sensor may be encapsulated into a limited space system enclosed in a sealed container with an optical window and interfaced with a substrate such as glass or a silicon wafer. Moreover, in some embodiments of the present disclosure, a thermal anneal step in an inert gas, may regenerate a 2D TMDC-containing sensor to allow a single sensor to be used for multiple humidity measurements.

FIG. 1 illustrates an exemplary device 100 that may be utilized for measuring the humidity of a gas sample contained within a sample volume 130. In this example, the device 100 includes a film 120, such as a monolayer film of a TMDC-containing material. The film 120 may be positioned on a substrate 110, where the substrate 110 provides physical support for the film 120. The film 120 may be positioned such that it is in physical contact with the gas to be measured, with the gas positioned in a sample volume 130. Moisture in the gas contained in the sample volume 130 may interact with the film 120 such that the PL induced by light directed to a surface of the film 120 can be measured and analyzed to estimate the amount of moisture contained in the sample volume 130. As shown in FIG. 1, a light source 140 may radiate a portion 150 of a surface of the film 120 with a first light 145, resulting in the portion 150 to photoluminesce, forming a second light 175 that is emitted from the portion 150 of the surface. At least a portion of this emitted second light 175 may then be captured by a detector 170, which is oriented towards the photoluminescing portion 150 of the film 120. The detector 170 may then generate a signal 180 that represents at least one parameter of the emitted second light 175, which may be sent to a processor 185 that analyzes the signal 180 and calculates an output 190 representing the water concentration of the gas contained in the sample volume 130.

As described herein, a film 120 may be constructed of a transition metal dichalcogenide (TMDC), with examples of TMDCs including tungsten disulfide, tungsten diselenide, tungsten ditelluride, molybdenum disulfide, hafnium disulfide, iridium disulfide, manganese diselenide, molybdenum diselenide, molybdenum ditelluride, niobium diselenide, niobium disulfide, platinum diselenide, platinum disulfide, rhenium diselenide, rhenium disulfide, rhenium ditelluride, zirconium disulfide, titanium(IV) sulfide, titanium disulfide, tungsten diselenide, tungsten ditelluride, hafnium diselenide, vanadium disulfide, and/or vanadium diselenide. In some embodiments of the present disclosure, a film 120 of TMDC may have a monolayer thickness of about 3 atoms (e.g. between about 0.5 nm and about 1 nm). In some embodiments of the present disclosure, a film 120 may have a thickness greater than one monolayer, for example between about 1 nm and about 10 nm. The lateral width of the TMDC does not limit the process and can be as large as grown and/or deposited and as small as possible, while being large enough to attain enough signal from the photoluminescence measurement. A substrate 110 may be constructed of any material, such as quartz, silicon with or without an oxide layer (e.g. indium tin oxide), metal, etc. A film 120 may be grown or deposited onto a substrate 110 by chemical vapor deposition, atomic layer deposition, mechanical and chemical exfoliation, transfer from one substrate to another, etc.

In some embodiments of the present disclosure, a sample volume 130 may have a volume between about 1 milliliter and 1 $m^3$. A gas contained within a sample volume 130 may include air having a temperature between 0° C. and 100° C. and having a relative humidity between zero percent relative humidity and 100 percent relative humidity. However, the devices and methods described herein may be utilized for measuring the moisture in other gas environments that include other constituent elements; e.g. other than nitrogen and oxygen. For example, other gas environments that may be analyzed using some of the embodiments described herein include chemical process environments and/or analytical gas streams; e.g. inert gases, reaction gases, toxic gases, flammable gases etc. A sample volume 130 may be defined the solid walls forming a cavity. In some embodiments of the present disclosure, a sample volume 130 may be a cavity having a inlet and an outlet, where the gas being tested is either continuously directed into the cavity to leave the cavity through the outlet, or the gas is directed to the cavity in a periodic fashion. Gas flow may be achieved using a blower and/or a pump.

In some embodiments of the present disclosure, a light source 140 may include a broadband light such as a light-emitting diode (LED) and/or a light source that emits essentially a single wavelength of light (e.g. a laser at 532 nm) between about 400 nm and about 650 nm. A detector 170 for measuring the second light 175 emitted from the film 120 as a result of radiating the portion 150 of the film 120 with the first light 145 produced by the light source 140 may include at least one of silicon charge-coupled device (CCD) or other visible light detectors.

Referring again to FIG. 1, in some embodiments of the present disclosure, the functions of a processor 185 may be implemented in hardware, software, firmware, or any combination thereof. If implemented in software, the functions may be stored on or transmitted over, as one or more instructions or code, a computer-readable medium and executed by a hardware-based processing unit. Computer-readable media may include computer-readable storage media, which corresponds to a tangible medium such as data storage media, or communication media, which includes any medium that facilitates transfer of a computer program from one place to another, e.g., according to a communication protocol. In this manner, computer-readable media may generally correspond to (1) tangible computer-readable storage media, which is non-transitory or (2) a communication medium such as a signal or carrier wave. Data storage media may be any available media that can be accessed by one or more computers or one or more processors to retrieve instructions, code and/or data structures for implementation of the techniques described in this disclosure. A computer program product may include a computer-readable storage medium.

By way of example, and not limitation, such computer-readable storage media may include at least one of RAM, ROM, EEPROM, CD-ROM and/or other optical disk storage, magnetic disk storage, and/or other magnetic storage devices, flash memory, and/or any other medium that can be used to store desired program code in the form of instructions or data structures and that can be accessed by a computer. Also, any connection is properly termed a computer-readable medium. For example, if instructions are transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. It should be understood, however, that computer-readable storage media and data storage media do not include connections, carrier waves, signals, or other transient media, but are instead directed to non-transient, tangible storage media. Disk and disc, as used herein, includes compact disc (CD), laser disc, optical disc, digital versatile disc (DVD), floppy disk and Blu-ray disc, where disks usually reproduce data magnetically, while discs reproduce data optically with lasers. Combinations of the above should also be included within the scope of computer-readable media.

Instructions may be executed by one or more processors, such as one or more digital signal processors (DSPs), general purpose microprocessors, application specific integrated circuits (ASICs), field programmable logic arrays (FPGAs), or other equivalent integrated or discrete logic circuitry. Accordingly, the term "processor", as used herein may refer to any of the foregoing structure and/or any other structure suitable for implementation of the techniques described herein. In addition, in some aspects, the functionality described herein may be provided within dedicated hardware and/or software modules. Also, the techniques may be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of inter-operative hardware units, including one or more processors as described above, in conjunction with suitable software and/or firmware.

Figure 2A:
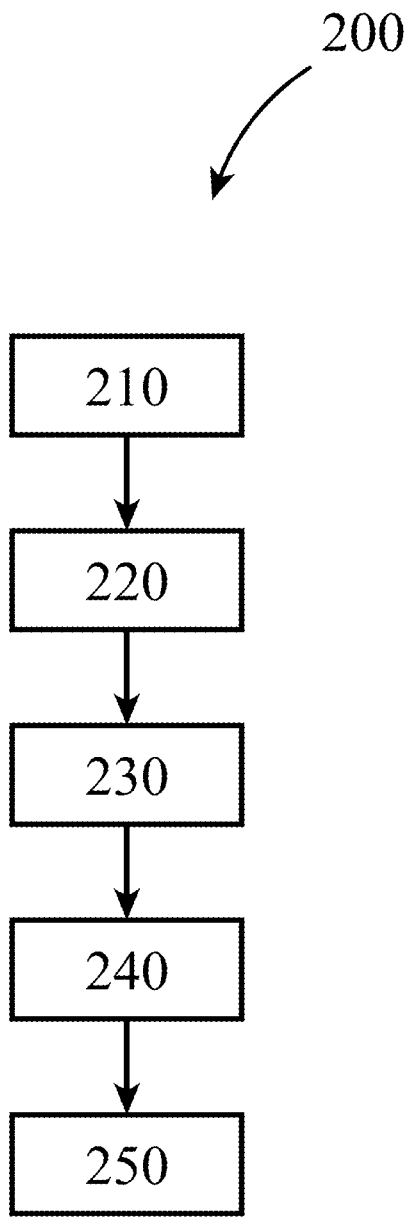
FIG. 2A illustrates a method for measuring humidity, according to some embodiments of the present disclosure.

FIG. 2A illustrates a method 200 for measuring the moisture content of a gaseous environment, according to some embodiments of the present disclosure, that utilizes a device 100 like that shown in FIG. 1. A method 200 may include exposing 210 a TMDC-containing film to a gaseous environment that contains, for example, an amount of water in a gas or vapor phase. The method 200 may also include, during the exposing 210 of the film, the directing 220 of a light to the TMDC-containing film, such that the directing 220 results in at least a portion of the film to photoluminesce. In some embodiments of the present disclosure, the light may be provided at constant power and/or intensity for a predetermined amount of time. In some embodiments of the present disclosure, the method may include the varying 230 of at least one of the power/intensity of light used to induce the photoluminescing of the film and/or the time that the film is illuminated by the inducing light (i.e. "first light", where the PL is the "second light"). For example, the power of the light used to induce PL may be between 1 μW and 500 W with an illumination area between 0.5 μm$^2$ and 10 cm$^2$ and/or the whole film. In some embodiments of the present disclosure, the directing 220 of the PL inducing light may be for a period of time between 0.1 seconds and 1000 seconds. The method 200 may then proceed with the measuring 240 of the PL and concluding with the correlating 250 of the measured PL to a parameter of the gas being measured; e.g. relative humidity, concentration of water, etc.

Figure 2B:
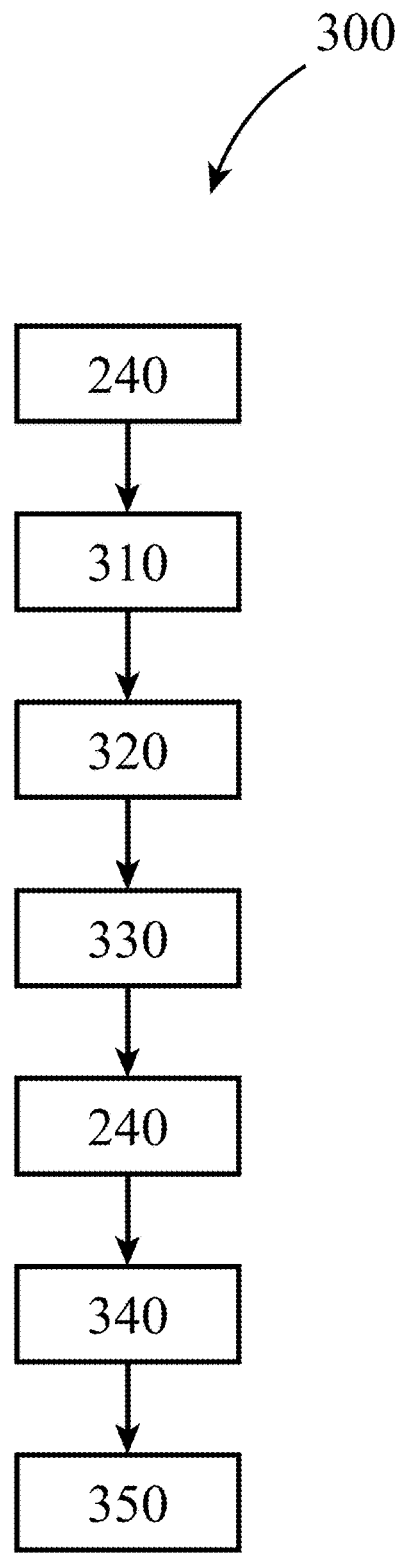
FIG. 2B illustrates a method for estimating humidity, according to some embodiments of the present disclosure.
Figure 3:
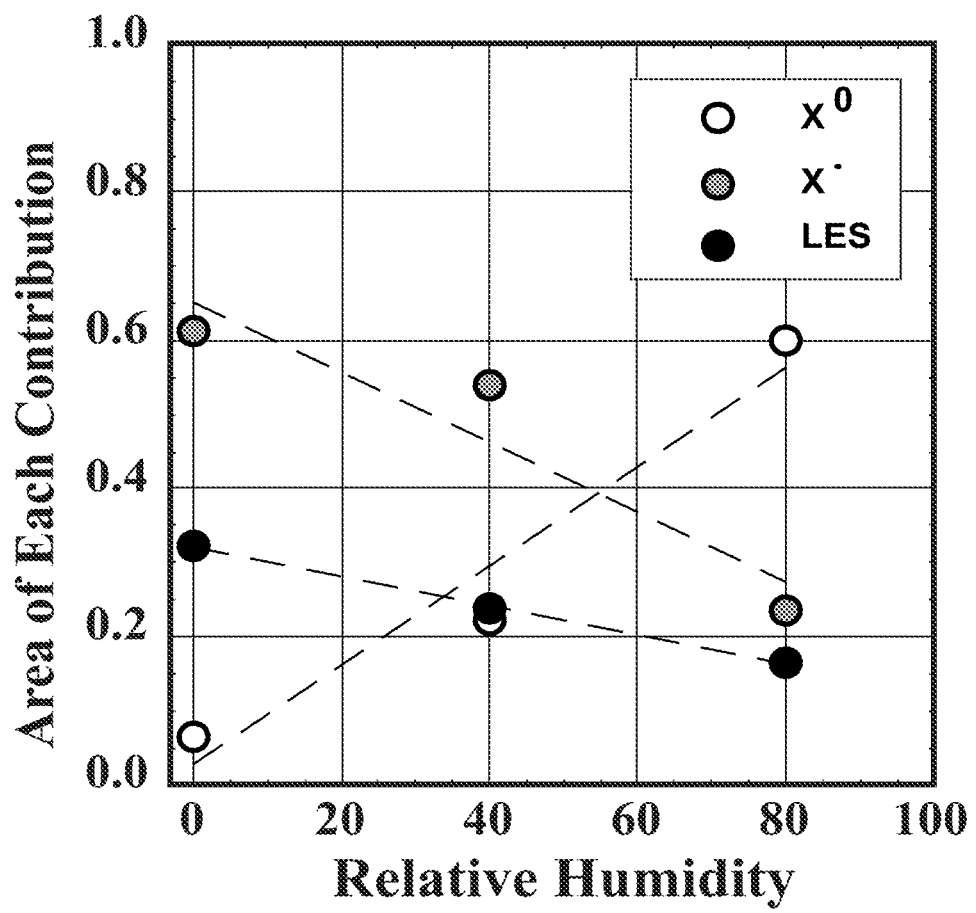
FIG. 3 illustrates linear correlations of photoluminescence contributions versus relative humidity obtained from experimental data, according to some embodiments of the present disclosure. Area of exciton ($X^0$ empty circles), trion ($X^-$ gray), and lower energy states (LES black) as a function of relative humidity of $WS_2$ environment.

FIG. 2B illustrates a method 300 for correlating the PL produced by a film as a result of the film being radiated with a light, while in contact with a gas, to a concentration of a component contained in the gas, according to some embodiments of the present disclosure. For a given gas environment (e.g. a fixed $O_2$, $N_2$, water atmosphere), the method 300 may begin with the measuring 240 the PL intensity spectra versus at least one of a power input (e.g. 6.5 μW to 12.9 mW) and/or time (e.g. up to 1000 seconds). Next, estimating 310, for each power, using knowledge of the relative energy states of three contributing factors that affect the material's (e.g. $WS_2$) PL spectrum, the three factors being $X^0$ (excitons), $X^-$ (negative trions), and LES (low energy states), a Gaussian distribution for each of the three factors that fit the shape of the measured PL spectrum. The method 300 may then proceed with the calculating 320, from the Gaussian distributions, the contribution of each of the three factors to the measured PL spectrum. Next, the method may include creating 330 a calibration curved from a plot of at least one of the contributing factors versus gas environment conditions (e.g. humidity). With a calibration curve in hand, for an unknown gas environment condition (e.g. humidity), measuring 240 the PL spectrum generated at a known power and/or time may be performed. Extracting 340 at least one of the three contributing factors from the PL spectrum, and calculating 350 the humidity from the calibration plot. FIG. 3 illustrates an example calibration plot, according to some embodiments of the present disclosure.

By understanding how the environmental composition impacts the optoelectronic properties of transition metal dichalcogenide monolayers, it is demonstrated herein that simple photoluminescence (PL) measurements of tungsten disulfide ($WS_2$) monolayers can differentiate relative humidity environments. For example, the PL and photoconductivity of chemical vapor deposition grown $WS_2$ monolayers under three carefully controlled environments have been evaluated to show the feasibility of $WS_2$ for measuring the humidity of a gas: inert gas ($N_2$), dry air ($O_2$ in $N_2$), and humid nitrogen ($H_2O$ vapor in $N_2$). The $WS_2$ PL was measured as a function of power provided by a 532-nm laser and exposure time and was deconvoluted into the exciton ($X^0$), negative trion ($X^-$), and lower energy state(s) (LES) contributions. Under continuous illumination in either $O_2$ or $H_2O$ vapor environment, a dramatic increase in PL intensity relative to the PL in an inert environment was observed, effects that were dominated by trion emission increasing with diminished exciton emission ($O_2$ environment) or, overall, increasing emission where the exciton contribution was predominate ($H_2O$ environment). These drastic increases in PL are anticorrelated with corresponding decreases in photoconductivity. The results suggest that both $O_2$ and $H_2O$ react photochemically with the $WS_2$ monolayer surface, modifying the optoelectronic properties, but do so via distinct pathways. These optoelectronic differences were used to differentiate the amount of humidity in the air. As shown herein, this understanding of the ambient condition impacts on $WS_2$ monolayers enables novel humidity sensors as well as a better understanding of the correlation between TMDC surface chemistry, light emission, and photoconductivity.

Figure 4A:
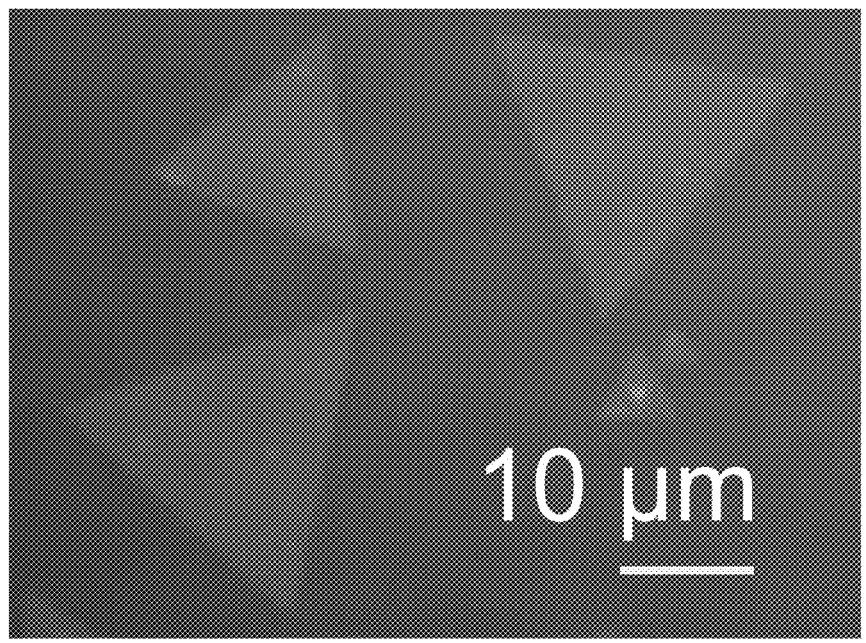
FIG. 4A illustrates a microscope image of CVD monolayer $WS_2$, according to some embodiments of the present disclosure.

The optoelectronic changes to monolayer $WS_2$ were monitored under different environmental conditions with a combination of Raman, absorption, and PL measurements. The as-grown $WS_2$ monolayers (~20 μm in width, see FIG. 4A) samples were transferred onto quartz substrates (10 cm by 5 cm) and were then annealed in a $N_2$ glove box. Samples that were maintained in this environment are referred to as "$N_2$". Alternatively, the thermally annealed samples were exposed to dry air (~22 vol. % $O_2$ in $N_2$) for one hour and are labeled as "$O_2$," or exposed to $H_2O$ vapor in $N_2$ for one hour, labeled as "$H_2O$". Throughout this study, one quartz substrate was reused by annealing in an inert atmosphere, which contained many $WS_2$ monolayers and few-layer triangles and alternated the type of environment. Each measurement was repeated 2 to 5 times. When using confocal Raman and PL, the same monolayer triangles were probed for repeated measurements. The effects seen in $O_2$ or $H_2O$ environments were shown to be reversible upon re-annealing in $N_2$. For the absorption and TRMC measurements, the entire substrate was averaged, which contained monolayers and few-layers.

Figure 4B:
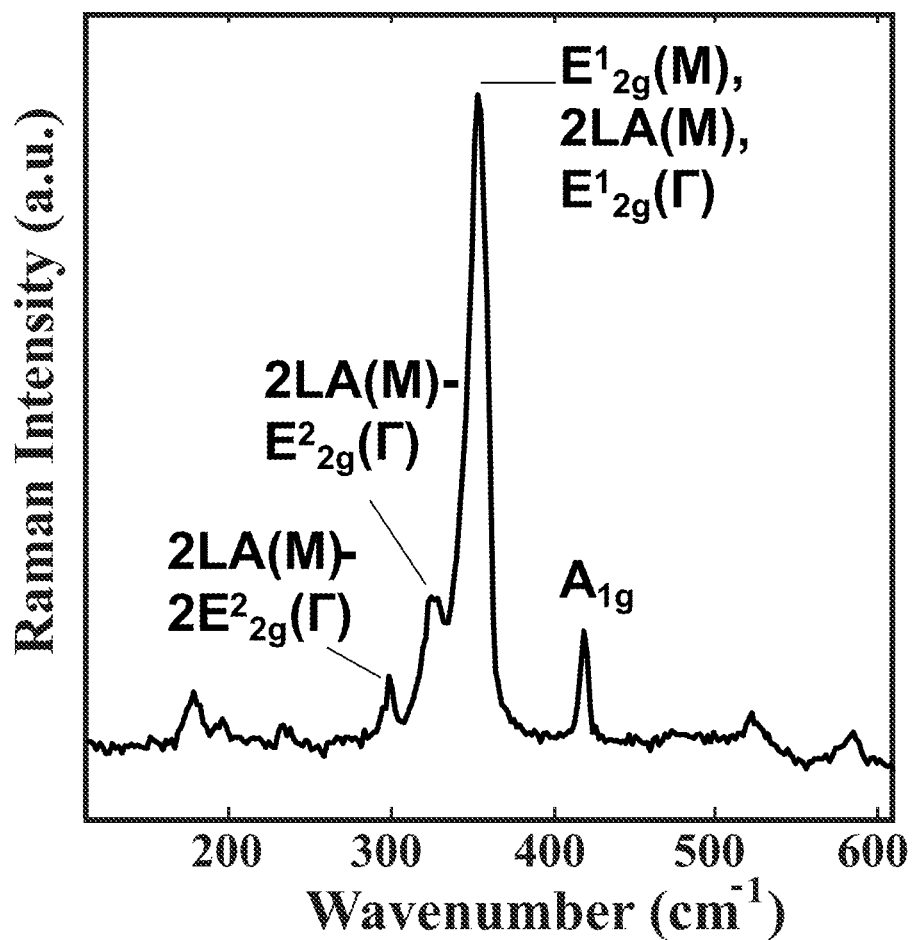
FIG. 4B illustrates a Raman spectrum of monolayer $WS_2$ exposed to $N_2$, according to some embodiments of the present disclosure. The spectrum is representative of $WS_2$ exposed to the various environments, as no appreciable changes are observed for different environments.
Figure 4C:
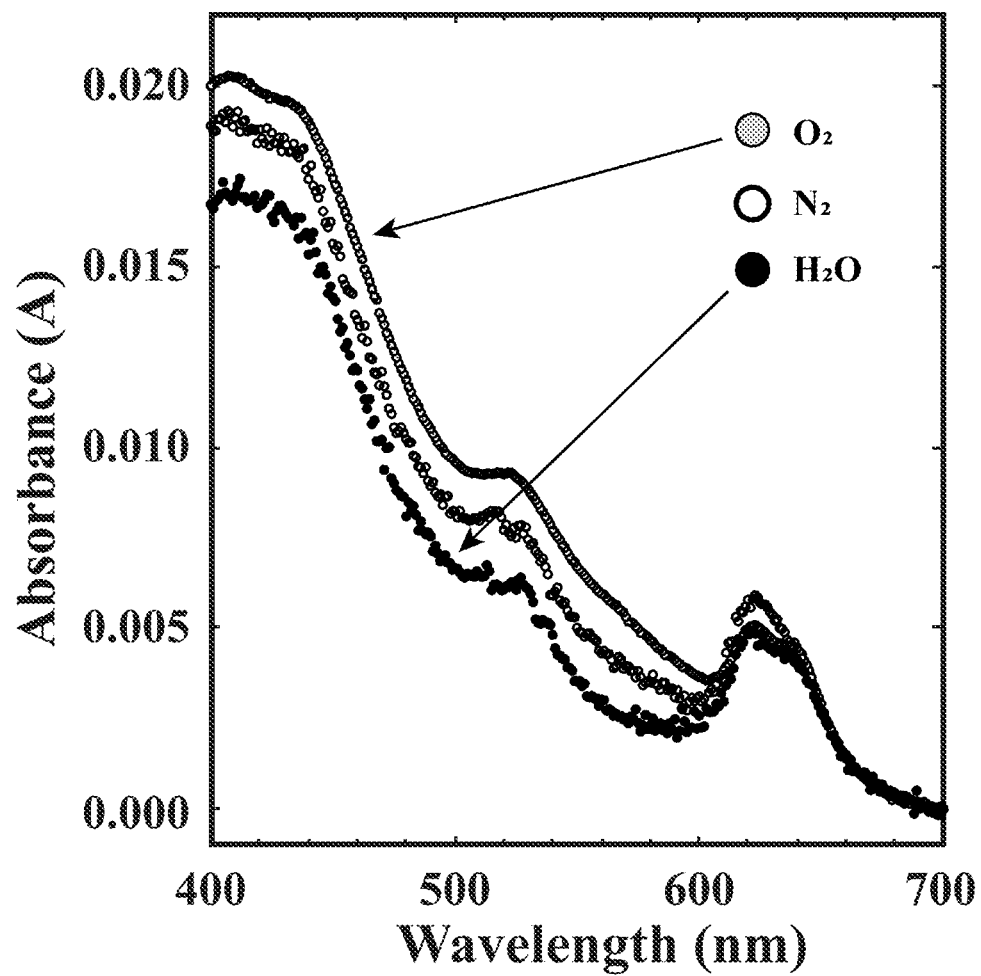
FIG. 4C illustrates absorption spectra of $WS_2$ in $N_2$, $O_2$, and $H_2O$ vapor, according to some embodiments of the present disclosure.

The Raman spectra for thermally annealed, CVD-grown $WS_2$ has the expected in-plane mode $E_{2g}$ and out-of-plane mode $A_{1g}$ (see FIG. 4B), which supports high purity $WS_2$ monolayers. The Raman spectra do not show obvious changes when $WS_2$ was exposed to the different environmental conditions, suggesting the overall structure of $WS_2$ remained unaffected. The $WS_2$ absorption spectra are shown in FIG. 4C for the three controlled environments. The A and B excitons are observed at 610 and 510 nm. A lower energy shoulder was observed on the A exciton, which was present under all environments and did not change with additional 532-nm exposure.

Photoluminescence of CVD monolayer $WS_2$. PL is one of the favorite hands-on tools to determine the properties of $WS_2$ monolayers, such as film quality, thickness, doping levels etc. Based on previous experimental reports and peak assignments, the $WS_2$ PL can be interpreted as arising from four different components: $X^0$, $X^-$, localized states, and biexcitons. Note $X^0$ denotes an exciton state which is composed of a Coulombically bound electron and hole, $X^-$ denotes negative trion which is composed of a Coulombically bound state of 2 electrons and a hole, localized-states refer to defect-related emissions which are often characterized as defect-bound excitons, and biexcitons refer to the Coulomb-bound complex of two excitons. Specifically, emission from the lower energy, localized states appears below the exciton/trion and is often found in CVD $WS_2$ where the monolayers may contain numerous defects, which are believed to be sulfur vacancies. Several studies also identify biexciton emission in CVD $WS_2$ monolayers, below the exciton/trion, by increasing the excitation power at cryogenic temperatures. However, due to the electron-phonon interaction at room temperature, it is difficult to distinguish localized and biexciton emission states; therefore, we do not separate them in these studies and identify them collectively as LES (low energy states) in our deconvoluted PL. The weighting or distribution of these contributions can lead to very different overall PL peak positions and shapes, which can be modulated by sample quality, excitation power density, as well as environmental factors, such as temperature, substrate, doping level, and ambient conditions.

Figure 5A:
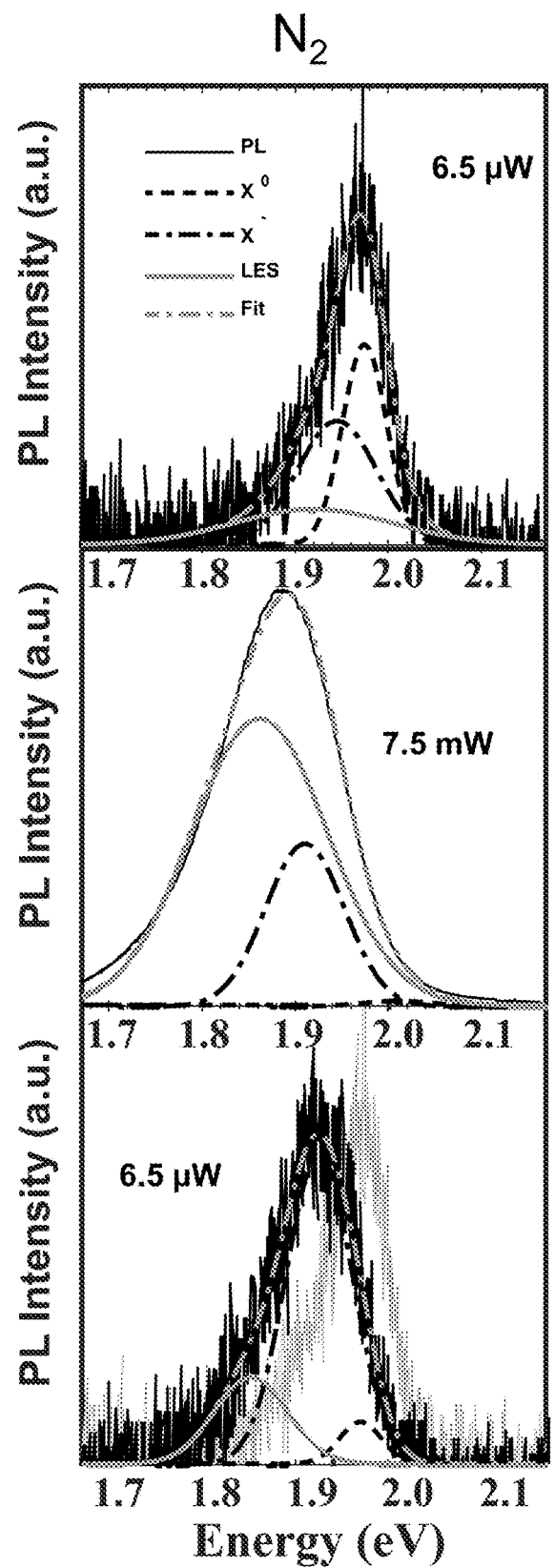
FIGS. 5A, 5B, and 5C illustrate monolayer $WS_2$ PL changes via laser power cycling of 532-nm laser irradiation under $N_2$, $O_2$, and $H_2O$ conditions, respectively, according to some embodiments of the present disclosure. As the laser power was varied, the laser position on the $WS_2$ was maintained; however, the laser spot was different for each environment. These measurements were repeated 5 times with similar results each time. The excitation power was increased from 6.5 μW (top plots) to 7.5 mW (middle plots) and extended to the highest power (12.9 mW, and then decreased back to 6.5 μW (bottom) for monolayer $WS_2$ in the $N_2$, $O_2$, and $H_2O$ environment, respectively. Here, the second-highest excitation power (7.5 mW) data is demonstrated for clarity and consistency since the 12.9 mW can saturate some of the measurements. For all of the plots, black lines are the collected PL results from the measurements. The black dashed/black dashed-dot/light solid/light dash-dot lines represent $X^0/X^-/LES/overall$-fitting for the monolayer $WS_2$ PL spectra, respectively. For comparison, the bottom plots also contain the original low energy PL from panel the top plots as a light trace.
Figure 5B:
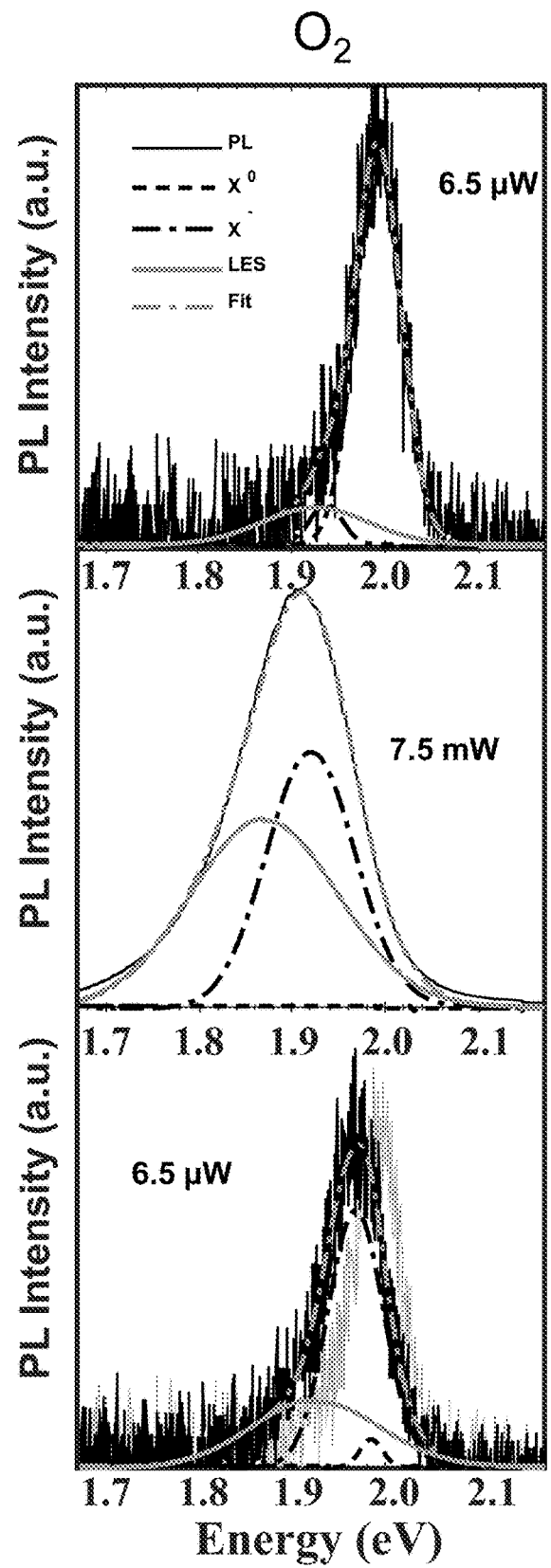
Figure 5C:
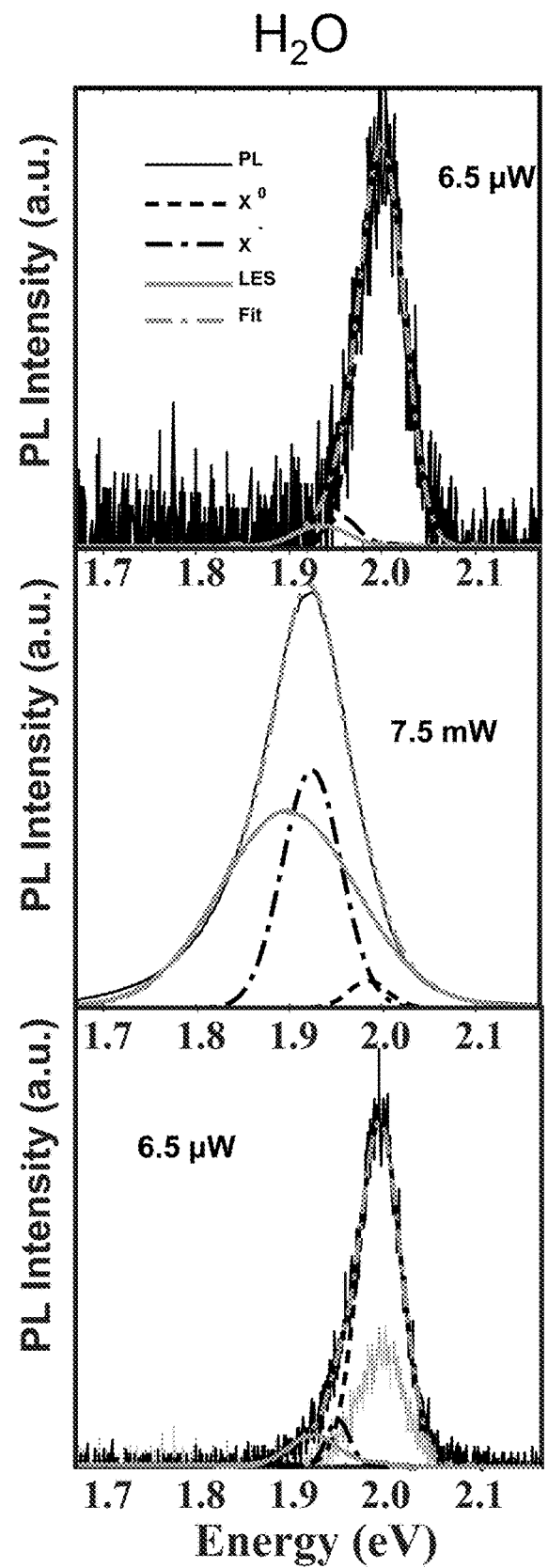

Excitation-Power Dependent PL Studies. Laser power-dependent PL was used to deconvolute the PL into three Gaussian components: $X^0$, $X^-$, and LES, as shown in FIGS. 5A, 5B, and 5C. The PL was measured as the laser power was cycled twice, where one cycle was from low to high to low excitation power (6.5 μW to 12.9 mW to 6.5 kW with a laser focus area of 2.7 μm$^2$), without moving the laser spot. A sampling of power-dependent PL spectra for the monolayer $WS_2$ in $N_2$, $O_2$, and $H_2O$ are demonstrated in FIGS. 5A, 5B, and 5C, respectively, for the first laser power cycle. For the first PL power-dependent cycle, the integrated intensities and percentage contribution for the $X^0$, $X^-$ are shown in FIGS. 6A, 6B, and 6C, for $N_2$, $O_2$, and $H_2O$, respectively.

Figure 6A:
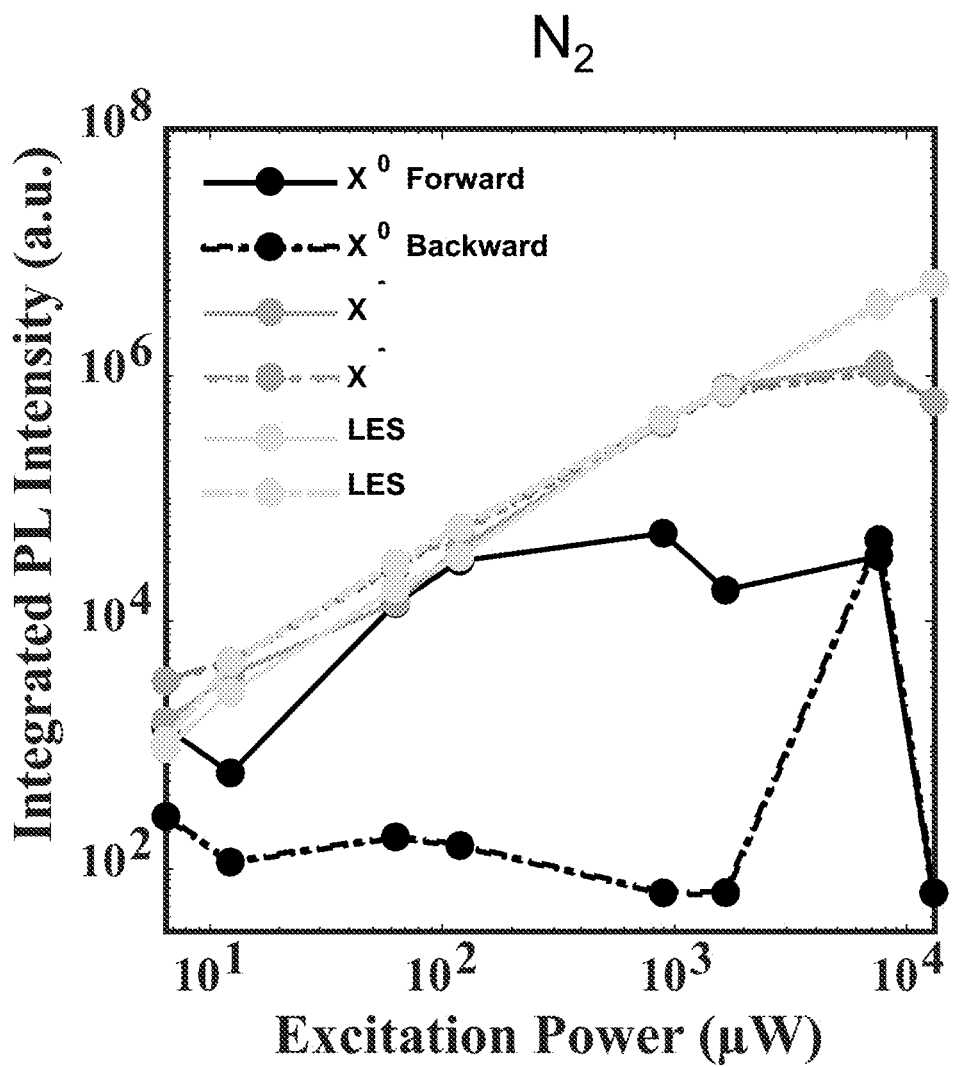
FIGS. 6A, 6B, and 6C illustrate integrated PL area of $X^0$, $X^-$, and LES as a function of excitation power derived from the fitting results from FIG. 5A for the three environments, in $N_2$, $O_2$, and $H_2O$, respectively, according to some embodiments of the present disclosure. The solid and dashed lines represent the PL change as the excitation power ascends and descends, respectively, for the first laser power cycle. The integrated PL intensity for the $2^{nd}$ laser power cycle is shown in FIG. 10.
Figure 6B:
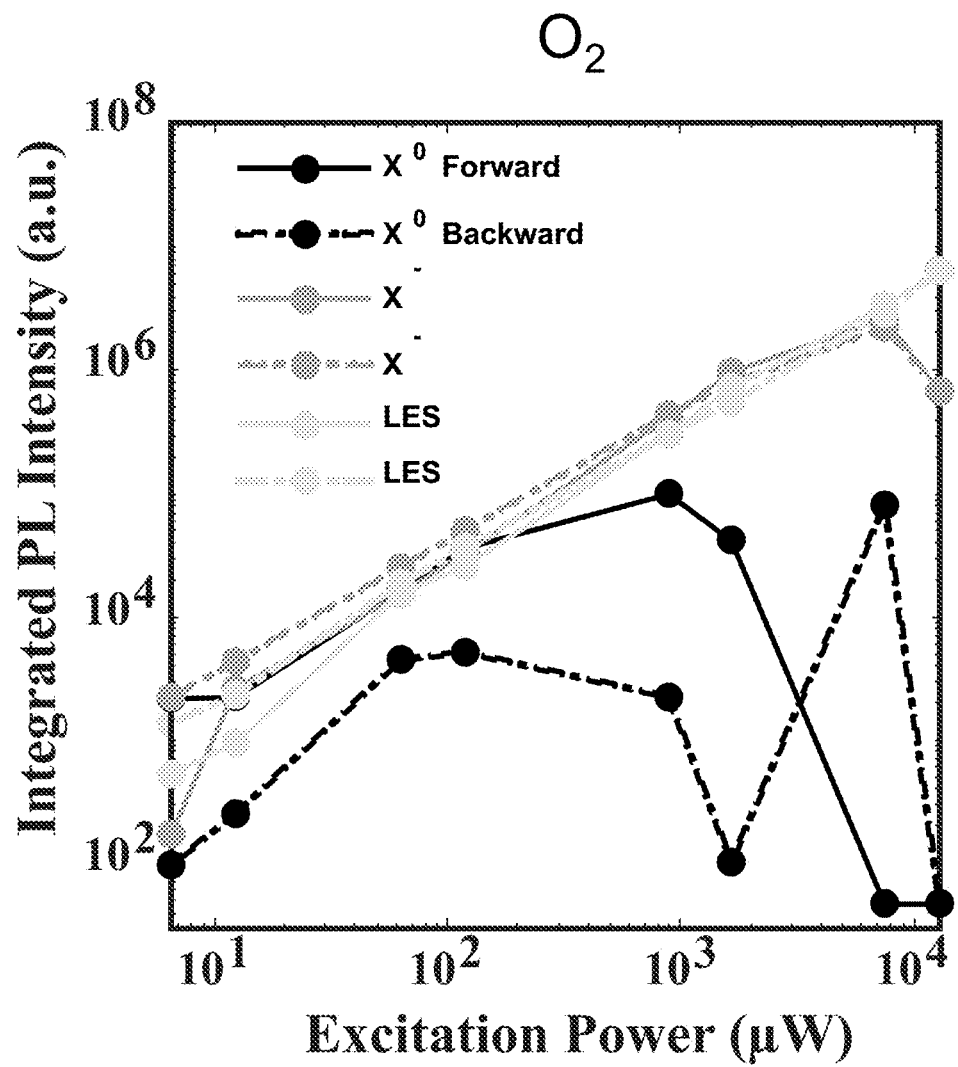
Figure 6C:
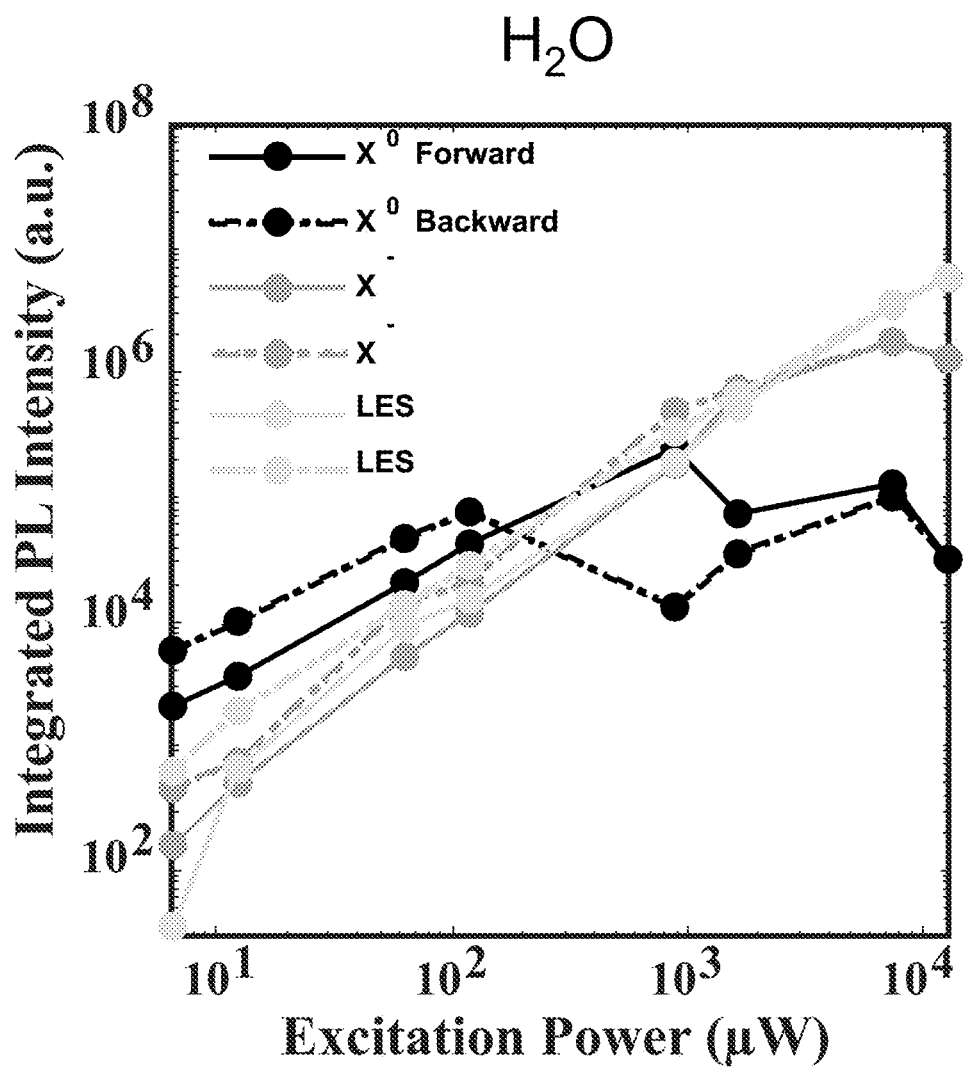

The excitation power significantly impacted the $WS_2$ PL properties in a $N_2$ environment (see FIG. 5A and FIG. 6A). At low excitation power (6.5 μW), $X^0$ and $X^-$ are about 37% and 40%, respectively, of the total PL (see top panel of FIG. 5A). As the laser power was increased, the overall PL peak position shifted to lower energy (~100 meV in see middle panel of FIG. 5A), and the PL intensity increased. Deconvolution of the spectrum taken at 7.5 mW demonstrates that the overall $WS_2$ PL change is dominated by a large increase in the LES contribution (see middle panel of FIG. 5A). The PL at higher laser power (7.5 mW) is approximately 77% LES and 22% $X^-$, which are formed from a higher concentration of photoexcited $X^0$ and free carriers and results in a substantial increase of biexciton and trion emission. Upon returning to the lowest excitation power, the original 6.5 µW $WS_2$ PL was not recovered, and the overall PL redshifted due to a decrease in the $X^0$ contribution to 7% and an increase in the $X^-$ contribution to 71%. This difference is emphasized in the bottom panel of FIG. 5A by plotting the original PL spectrum from the top panel of FIG. 5A as light a light trace and the PL spectrum after one laser power-dependent cycle as a dark trace. A second round of the laser power cycle did not induce further PL changes (not shown).

The power-dependent PL of monolayer $WS_2$ in an $O_2$ environment (see FIG. 5B and FIG. 6B) is different than the $N_2$ case. Initially, at low excitation power (see the top panel of FIG. 5B), $X^0$ dominated the PL with 76% of the integrated intensity, which led to a narrower overall PL shape than the $N_2$ case. At high excitation power (see the middle panel of FIG. 5B), the difference between $N_2$ and $O_2$ case was minimal, where the $X^-$/LES emissions were 36% and 63%, respectively. As the power was cycled back down, there was a slight PL redshift (see the bottom panel of FIG. 5B) that was due to a decrease of the $X^0$ to 6%. The fitting reveals that the $X^-$ component was about ~60% of the overall intensity, which is a similar trend to the $N_2$ case. One interesting difference between the $WS_2$ PL changes in $O_2$ compared to $N_2$ is that that second power-dependent cycle led to significant PL changes (not shown). Overall there was an increase in the PL intensity without an energetic shift; this was due to the $X^-$/LES increasing, which resulted in a higher PL quantum yield on the $2^{nd}$ excitation power cycle.

As for the $H_2O$ case, the $WS_2$ PL properties are very different (FIG. 5C and FIG. 6C) in respect of the component changes as a function of the laser power cycling. Initially, at low excitation power (see the top panel of FIG. 5C), the overall PL intensity was low compared to the $N_2$ and $O_2$ case, and the PL was mainly composed of emission from $X^0$, which is about 92%, resulting in a narrower PL. At higher excitation as shown in the middle panel of FIG. 5C, the PL spectrum was also narrower compared to the $N_2$ and $O_2$ cases at that power; this was due to blue-shifting of LES emission and a smaller FWHM of $X^-$ emission. As the excitation power was cycled back down (see the bottom panel of FIG. 5B), $WS_2$ demonstrated a significant PL increase at the same peak position as compared to the original PL at 6.5 µW. At low excitation power at the end of the first power cycle, $X^0$ emission was still the main contributor (84%) to the $WS_2$ PL in an $H_2O$ environment, which is a very different phenomena than $WS_2$ in $N_2$ or $O_2$ environments (see the bottom panels of each of FIGS. 5A, 5B, and 5C). The $2^{nd}$ excitation power cycle did not result in any additional changes and parallels the first cycle (not shown).

The deconvoluted PL contributions are summarized in the log-log plots shown in FIGS. 6A, 6B, and 6C, where solid traces represent the increasing excitation power and dashed traces describe the decreasing excitation power for the first power cycle. It is worth noting that at higher excitation power, the $X^0$ contribution is minor; therefore, the fitting results of the $X^0$ may be less accurate compared to the $X^-$/LES fits. For all three cases as the laser power increases, the overall PL intensity increased. However, the spectral weightings change as the laser power increased. Specifically, the relative $WS_2$ $X^0$ contribution decreased while $X^-$ and LES increased. As the power was cycled back down, the three cases vary. The $WS_2$ in $N_2$ and $O_2$ environments did not recover the original component contributions of the PL at low power and had little to no $X^0$ contribution (36% to 6% for $N_2$ and 76% to 6% for $O_2$), whereas component contributions of the $WS_2$ PL in $H_2O$ retained a similar level, i.e., the $X^0$ was still the main contributor (92% to 84%). The spectral contributions as a function of ascending laser power have been fit to a line and are shown in Table 1. The power cycle measurements of Raman spectra in all three environments did not demonstrate any obvious changes.

TABLE 1

Extracted slopes from linear fits for each PL contribution under various environments for ascending excitation power.

| Round 1 | $N_2$ (Forward) | $O_2$ (Forward) | $H_2O$ (Forward) |
|---|---|---|---|
| $X^0$ | 0.65 | 0.64 | 0.74 |
| $X^-$ | 1.09 | 1.36 | 1.41 |
| LES | 1.16 | 1.27 | 1.52 |
| Overall | 1.07 | 1.11 | 1.10 |

Figure 7A:
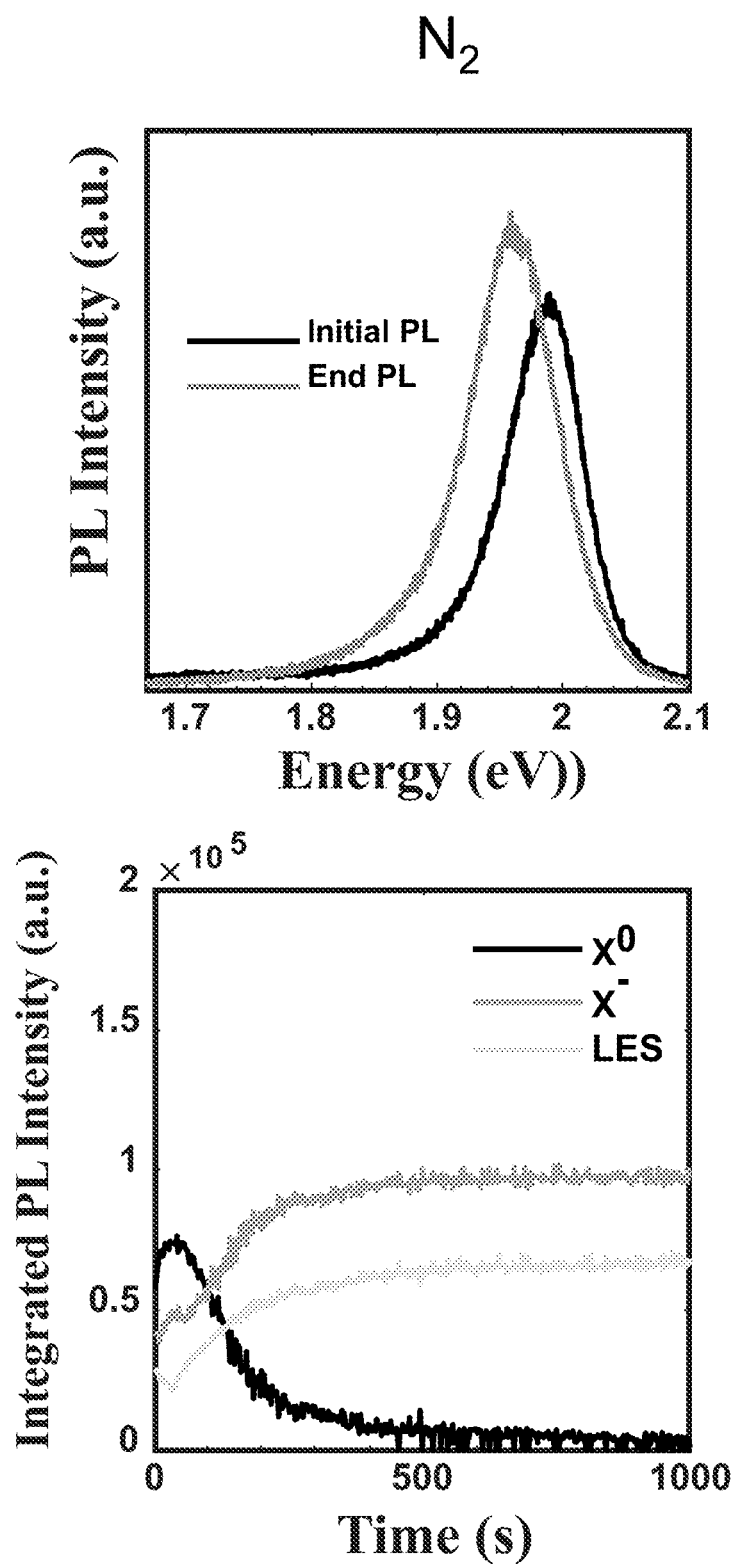
FIGS. 7A, 7B, and 7C illustrate (in each figures top panel) PL intensity of monolayer $WS_2$ before (dark) and after (light) 1000 s of continuous 532-nm laser illumination in $N_2$, $O_2$, and $H_2O$, respectively. Each of the figures lower panel illustrates for each environment, the overall PL deconvoluted into three Gaussians, corresponding to $X^0$ (dark), $X^-$ (lighter), and LES (lightest) emission intensities vs. illumination time. The laser intensity was 119 μW.
Figure 7B:
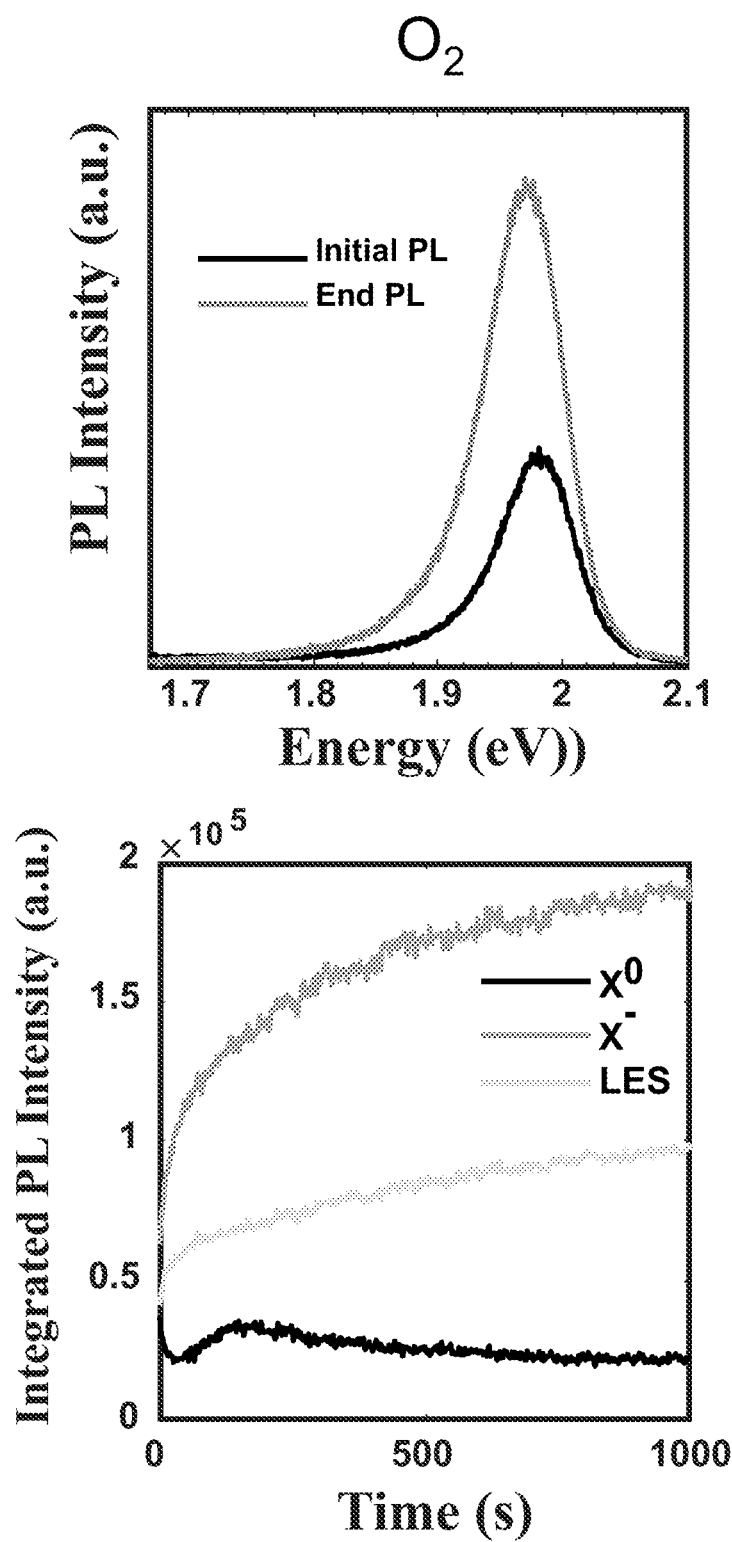
Figure 7C:
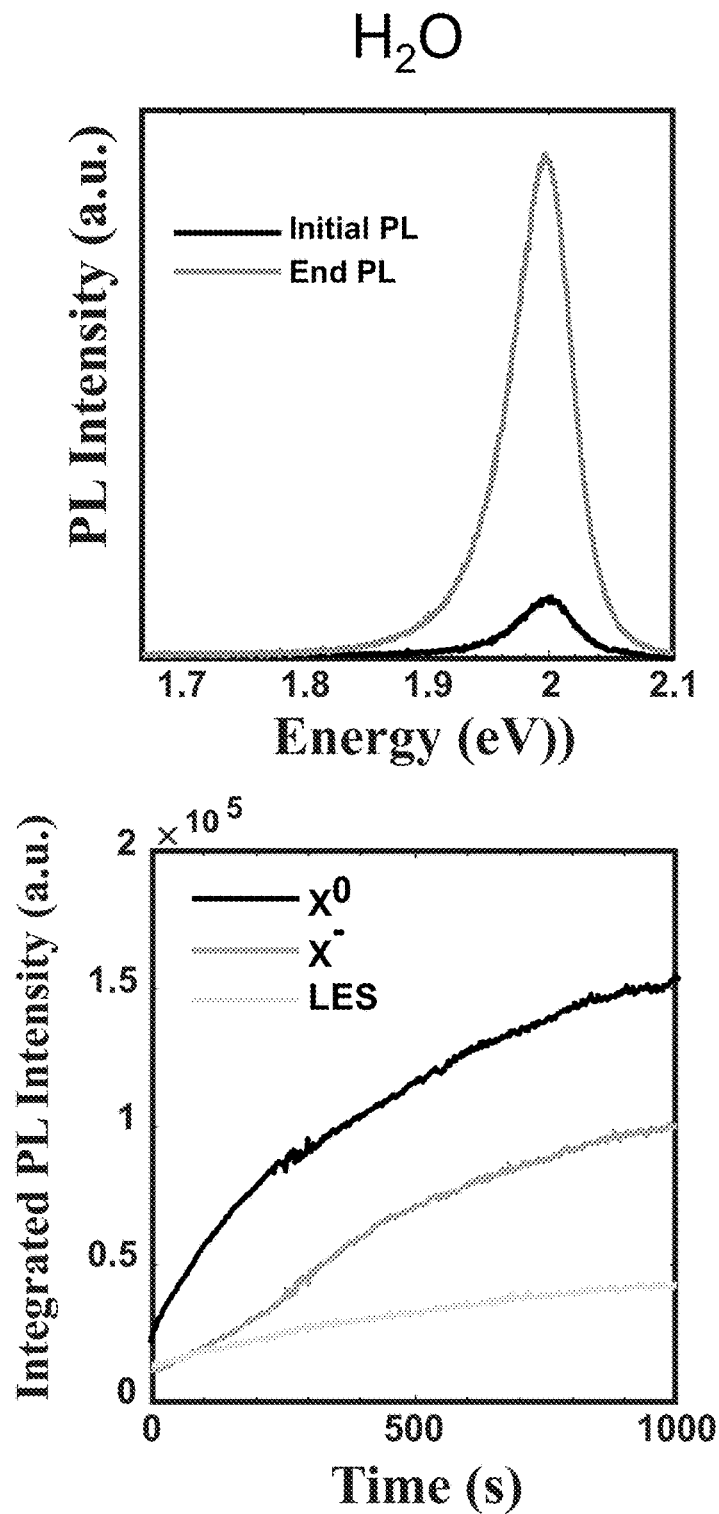

Excitation-Time Dependent PL Studies. To further investigate photo-chemical insight into the effects of illumination and environment on $WS_2$ PL, in-situ monitoring of the PL upon continuous 532-nm laser illumination was performed. The overall $WS_2$ PL into the $X^0$, $X^-$, and LES contributions were deconvoluted as a function of exposure time with 119-µW, 532-nm illumination for 1000 s. The PL spectra before and after laser exposure along with the deconvoluted relative intensities versus laser irradiation time are shown in FIGS. 7A, 7B, and 7C for $N_2$, $O_2$, and $H_2O$ environments, respectively. For the $N_2$ case, the top panel of FIG. 7A depicts the PL spectra of the $WS_2$ before and after the 1000-s laser irradiation. The overall PL peak center shifted from 1.99 eV to 1.96 eV, rendering a ~30 meV redshift. This redshift is comparable to the ~40 meV shift that was observed in the low-power PL measurements before and the first laser power cycle (see the bottom panel of FIG. 5A), suggesting long-time, moderate power laser irradiation triggers a very similar process as the short-time irradiation with high-power. The overall PL change is due to a decrease in the $X^0$ contribution in combination with an increase in both $X^-$ and LES contributions until reaching a steady magnitude after ~600 s (see the bottom panel of FIG. 7A). It was verified that the Raman spectra did not change under these conditions, suggesting the monolayer $WS_2$ crystal structure remained the same (not shown).

Figure 10:
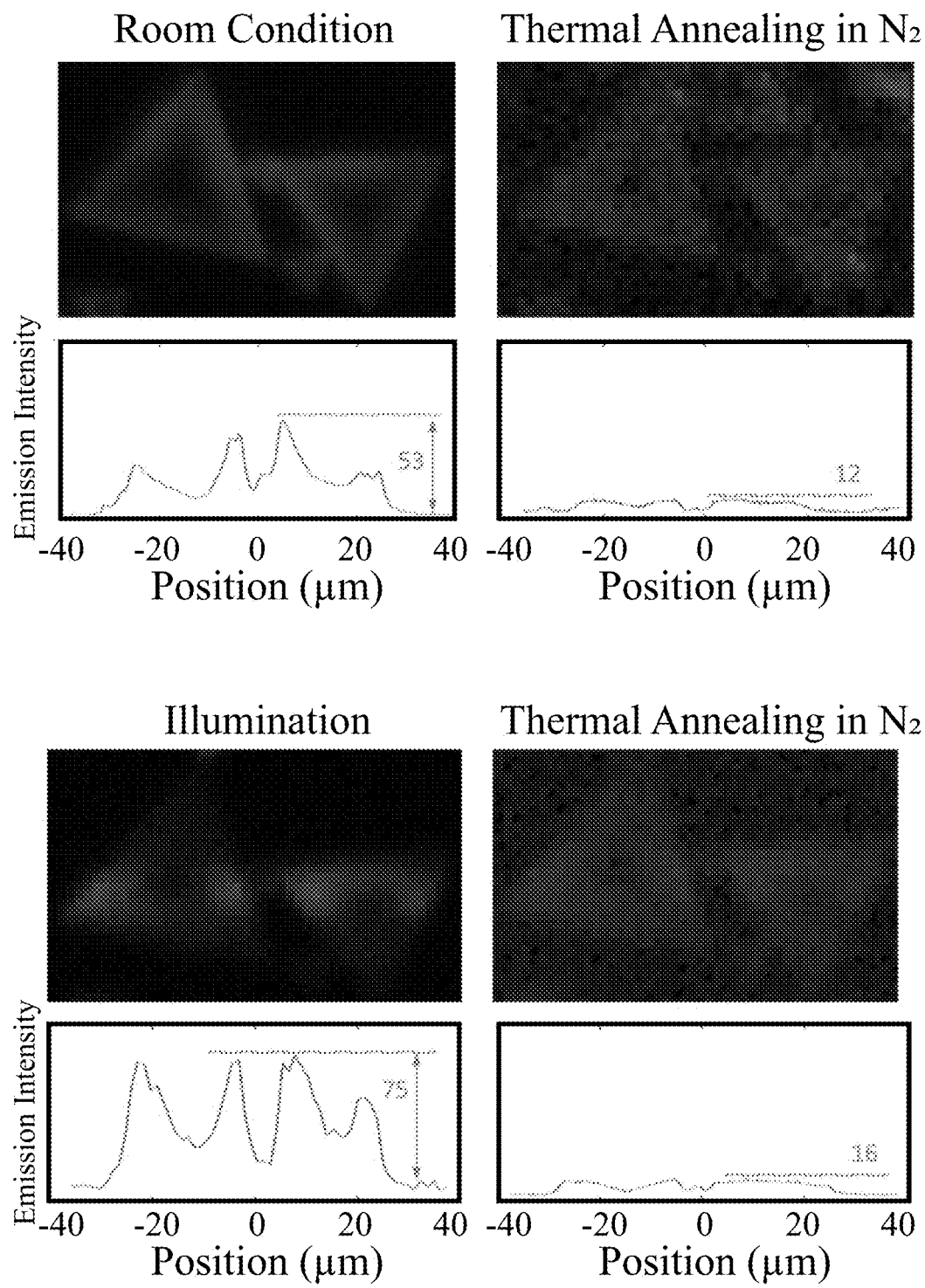
FIG. 10 illustrates PL mapping and emission intensity data resulting from thermal annealing of $WS_2$, according to some embodiments of the present disclosure.

When the $WS_2$ PL under an $O_2$ environment were analyzed, at t=0 s, there were not any apparent spectral differences from the $N_2$ case. During the 1000 s of 532-nm illumination (see the top panel of FIG. 7B), significant differences were observed compared to the $N_2$ environment. The $WS_2$ PL intensity after laser irradiation increased by more than a factor of 2 along with a ~10 meV redshift of the peak position, which is consistent with the results at low power following two power-dependent cycles. This PL enhancement was reversible via thermal annealing in an inert gas (see FIG. 10). Note: only the thermal annealing reversibility for the $O_2$ case is shown, but it applies to the $H_2O$ and $N_2$ cases, which allowed repeat measurements on the same $WS_2$ monolayers. the bottom panel of FIG. 7B demonstrates that the overall PL change is mostly due to the $X^-$ contribution, which more than doubled in an area with time, as well as the LES contribution, which grew in area by ~1.5. The growth of the $X^-$ and LES contributions increased the overall $WS_2$ PL intensity and redshifted the PL peak position. The $X^0$ changed little with laser illumination but did have some fluctuation during the first 300 s.

Similar to the laser power cycling measurement, the $WS_2$ PL in an $H_2O$ environment shows a distinct behavior following laser illumination compared to the $N_2$ and $O_2$ environments (see FIG. 7C). At t=0 s, the overall $WS_2$ PL intensity is minimized, narrower, and blue-shifted compared to the $N_2$ case. However, following 1000 s of laser illumination in $H_2O$, the $WS_2$ PL increased by a factor of ~7, while the overall PL shape and peak position remained nearly identical. The quantum yield enhancement is due to increased emission from all three radiative pathways, where $X^0$ is the main contributor, contributing about 50% of the total emission before and after illumination. The PL enhancement was different from the $N_2$ and $O_2$ cases.

Photoconductivity. TRMC was used to evaluate the influence that environmental molecules ($N_2$, $O_2$, and $H_2O$) have on long-lived ($\tau$>1 ns) photoconductivity when exciting at the $X^0$ transition (2.02 eV) transition. Using microwave conductivity enabled the use of laser fluences 2 orders of magnitude lower than are typically utilized for TRTS studies, providing data in a fluence regime that (1) was less affected by non-linear (e.g., Auger) processes that can reduce charge carrier yield and lifetime, and (2) may be more relevant to photoelectrochemical applications of these materials that would proceed at low fluence.

Figure 8A:
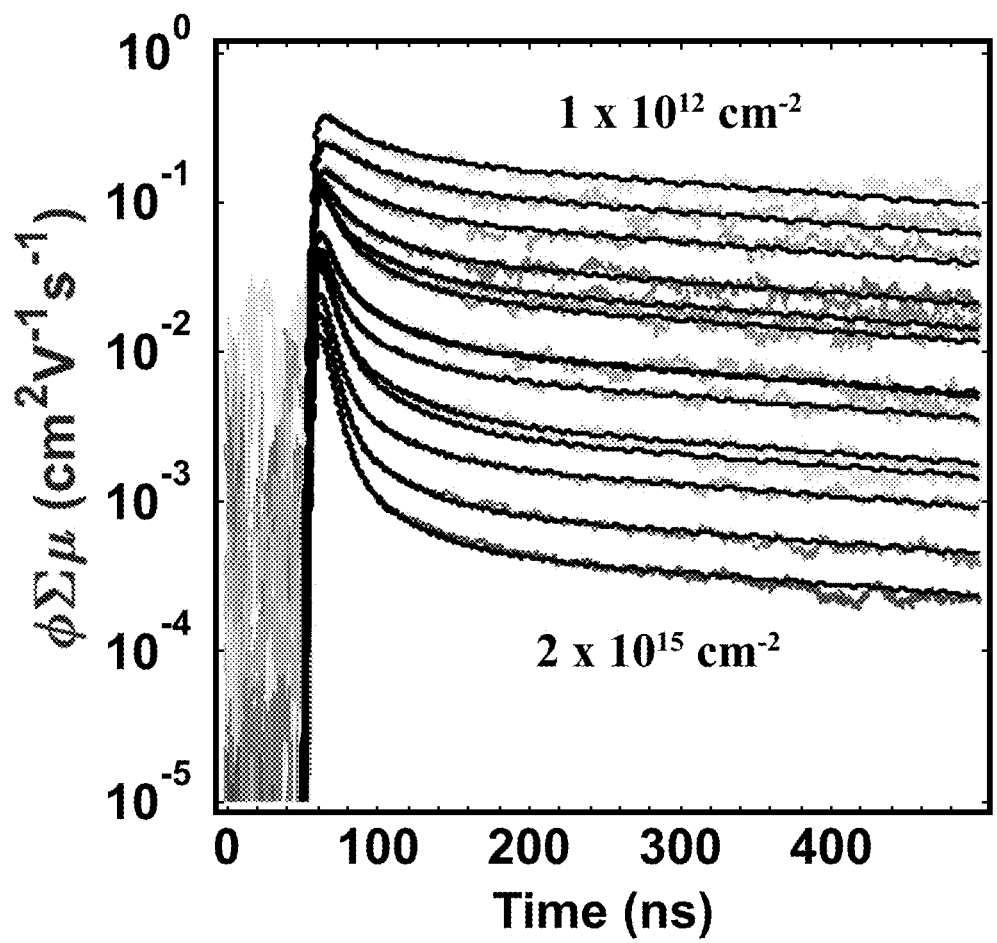
FIG. 8A illustrates representative photoconductivity transients at 2.02 eV ($X^0$) excitation as a function of absorbed laser fluence for annealed $WS_2$, expressed as the yield-mobility product, according to some embodiments of the present disclosure. The black lines are from a global fit to a sum of three exponentials ($\tau_1=2.6$ ns, $\tau_2=34$ ns, and $\tau_3=580$ ns).
Figure 8B:
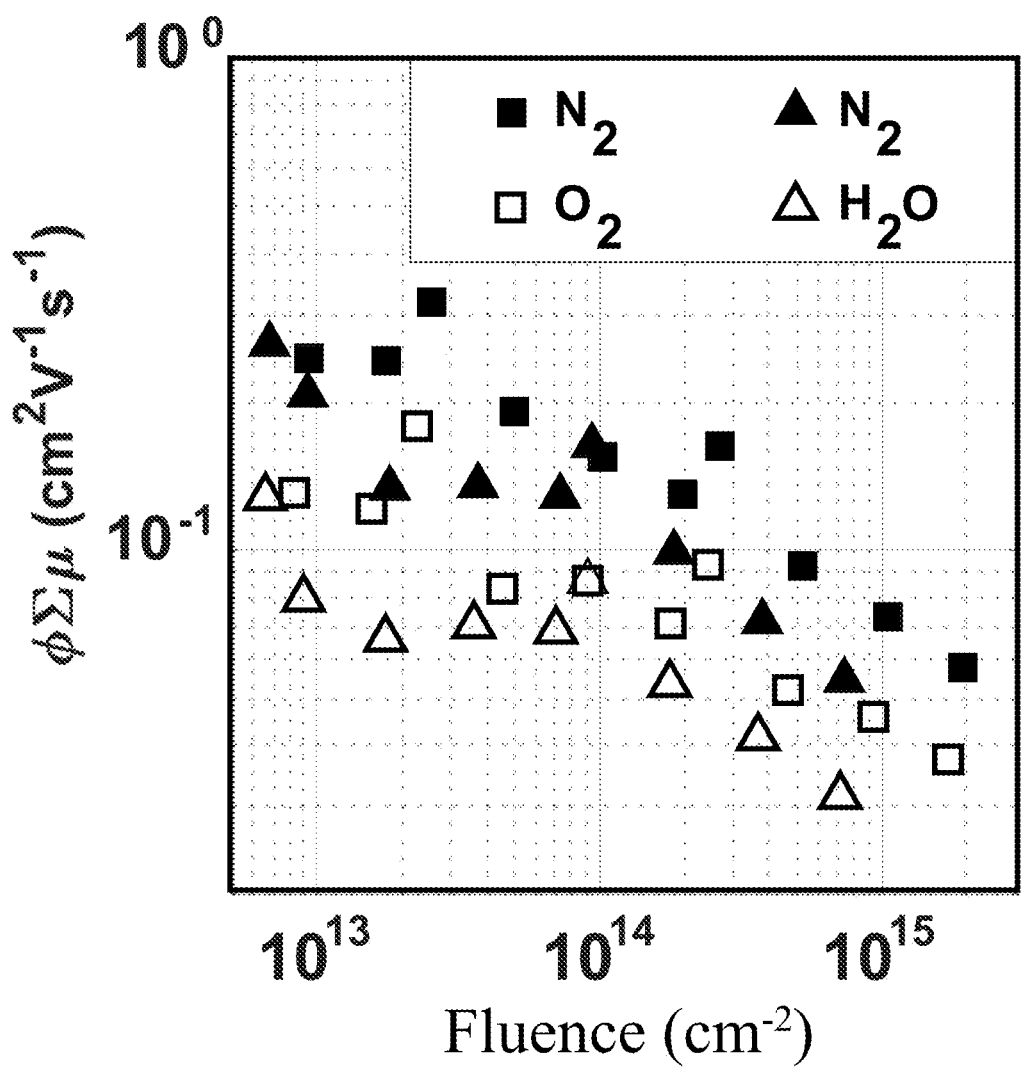
FIG. 8B illustrates yield-mobility products vs. excitation fluence, according to some embodiments of the present disclosure.
Figure 8C:
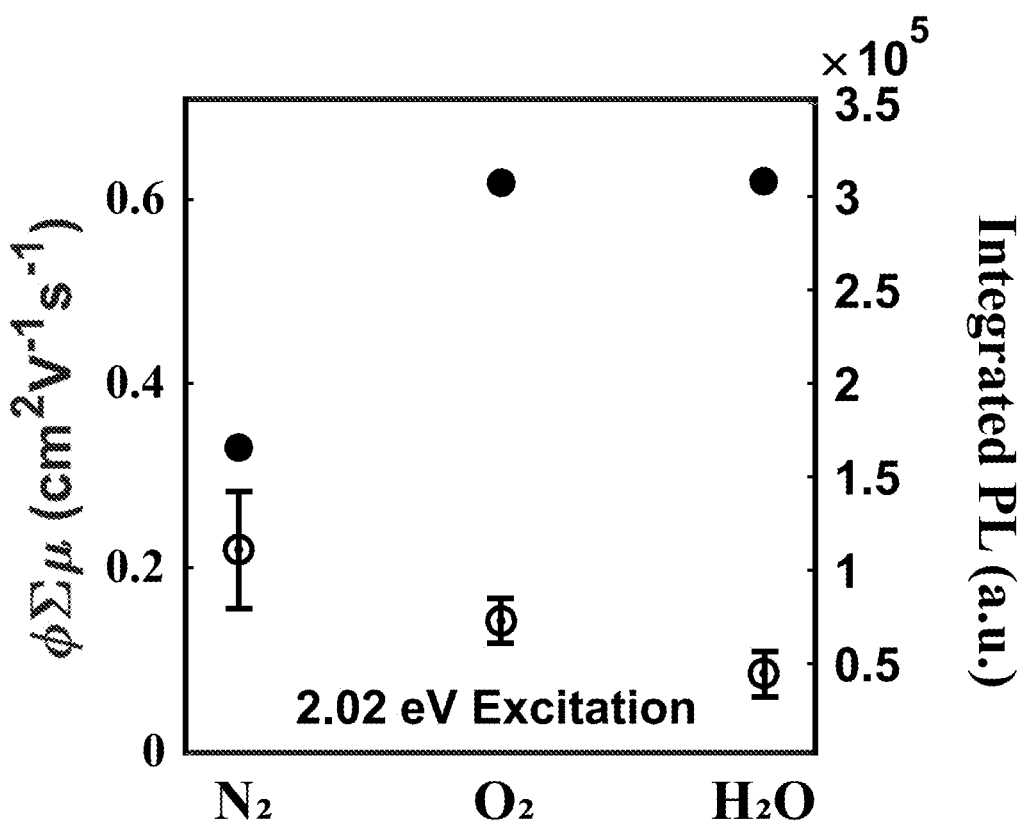
FIG. 8C illustrates extracted average yield-mobility products (blue) of the $WS_2$ in $N_2$, $O_2$, and $H_2O$ at an incident laser fluence of $1.3\text{-}2\times10^{13}$ $cm^{-2}$ along with the PL integrated area at t=1000 s (red) from FIGS. 7A, 7B, and 7C, according to some embodiments of the present disclosure.

The TRMC results are shown in FIGS. 8A, 8B, and 8C. FIG. 8A gives the photoconductivity transients for annealed $WS_2$, expressed as the product of charge carrier yield and the sum of the electron and hole mobilities ($\phi\Sigma\mu$). These transients are representative of all sample conditions investigated, in that the shape and trend with fluence were not dramatically altered by exposure to $O_2$ or $H_2O$ vapor. The black fit lines result from a global fit to the fluence-dependent data using the sum of three exponentials with time constants of $\tau_1$=2.6 ns, $\tau_2$=34 ns, and $\tau_3$=580 ns; this fitting procedure was performed for all of $WS_2$ TRMC measurements in order to parameterize the data and make sensible comparisons between sample conditions. $WS_2$ photoconductivity and dynamics are strongly fluence-dependent (see FIG. 8A). At an photon fluence of $10^{15}$ $cm^{-2}$, the photoconductivity transient was dominated by a fast 2.6 ns component, which is near the resolution limit of our experiment as presently configured. At $10^{12}$ $cm^{-2}$, the dominant decay component is 580 ns. These observations are consistent with bimolecular recombination being the dominant charge carrier loss process. This situation applies to all of the sample conditions measured, but the signal magnitude and lifetime varied according to the $WS_2$ environment. The yield-mobility products for the different laser fluences are depicted in FIG. 8B. FIG. 8C summarizes the results from FIG. 8B analysis for $WS_2$ exposed to $N_2$, $O_2$, and $H_2O$ conditions, comparing the average of the exponential amplitudes at an incident laser fluence (photons/pulse/area) between 1.3 and 2.0×$10^{13}$ $cm^{-2}$. In addition, the PL integrated area at 1000 s extracted from the top panels of each of FIGS. 7A, 7B, and 7C is included for comparison.

There are two clear observations from this TRMC data (see FIGS. 8A, 8B, and 8C). First, exposing the sample to $O_2$ or $H_2O$ vapor along with continuous 532-nm LED illumination for 12 h reduced the yield-mobility product and amplitude-weighted average lifetime compared to the annealed sample. Second, the yield-mobility product is anticorrelated with the PL integrated area. Interpreting microwave data is often complicated by the convolution of charge carrier yield and mobility. Following the initial generation of charges by the laser pulse (end-of-pulse $\phi\Sigma\mu$), the ensuing $\phi\Sigma\mu$ dynamics can be straightforwardly associated with the time-dependent density of mobile charges in the film because the relevant timescale (t>>100 ps) is much longer than that of carrier cooling. Thus, the main question is whether the different end-of-pulse $\phi\Sigma\mu$ values observed for $WS_2$ subjected to $O_2$ and $H_2O$ exposure result from differences in the nanosecond yield or mobility of charge carriers.

In this context, the anticorrelation between the $WS_2$ PL and yield-mobility product data is instructive. In excitonic semiconductors, the PL quantum yield is directly proportional to the number of photogenerated excitons that survive non-radiative processes to recombine radiatively. In contrast, the TRMC yield-mobility product is insensitive to Coulomb-bound excitons, but instead requires processes (e.g., spontaneous exciton dissociation, trapping, charge transfer, etc.) that transform the expected population of excitons into free electrons and/or holes. The concomitant enhancement of PL and reduction of $\phi\Sigma\mu$ is thus consistent with a photoinitiated reaction with $O_2$ or $H_2O$ vapor, which passivates or compensates $WS_2$ surface defects that would otherwise capture one of the mobile charges prior to exciton formation (within 1 ps). Equivalently the native $WS_2$ surface defects (before reaction with $O_2$ or $H_2O$ molecules) could act to dissociate excitons on a tens of picosecond timescale.

Figure 9A:
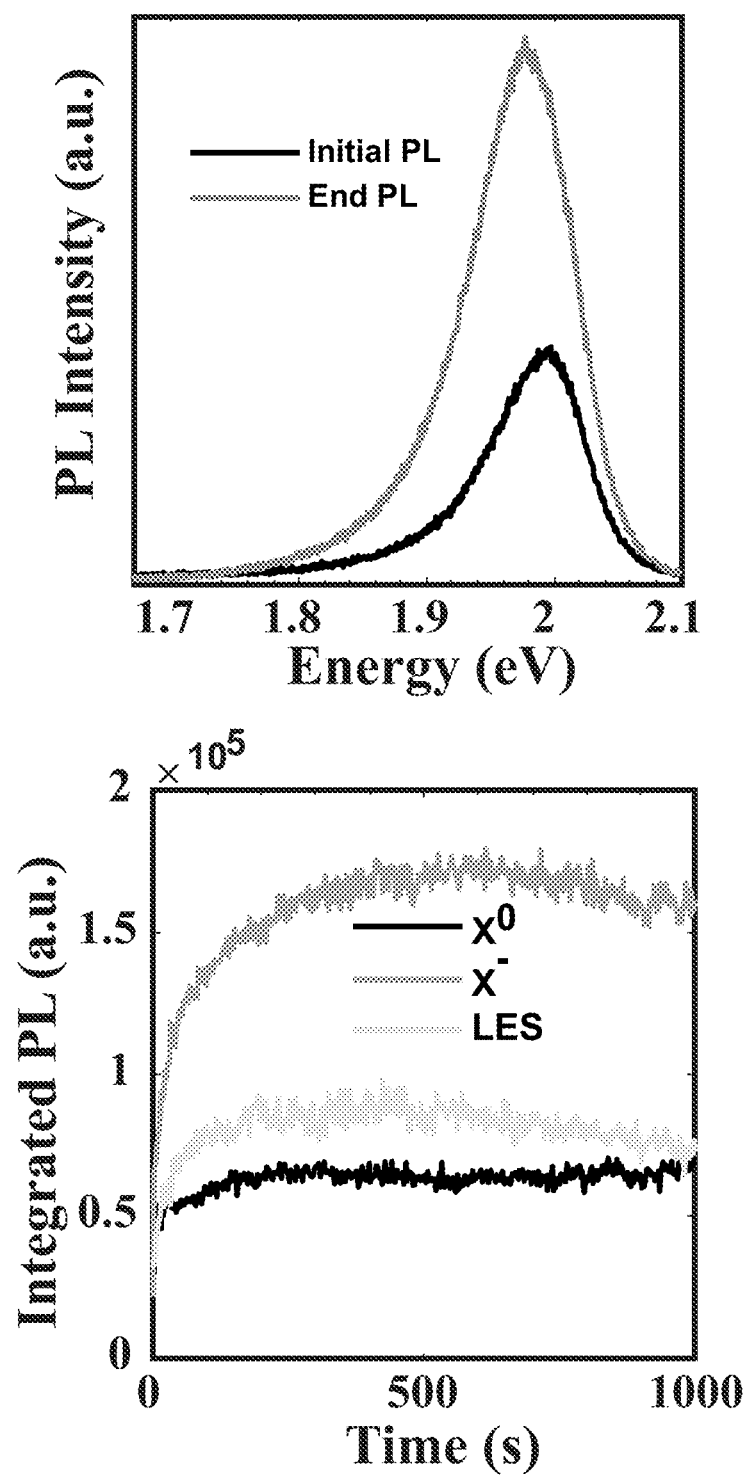
FIGS. 9A and 9B illustrate $WS_2$ PL changes under 1000 s, 532-nm laser irradiation with 40% relative humidity and 80% relative humidity, respectively, according to some embodiments of the present disclosure. The top plots illustrate PL spectra before (dark) and after (light) 1000-s laser irradiation of the $WS_2$ monolayer, for 40% and 80% relative humidity, respectively. The bottom plots illustrate deconvoluted PL fitting results for the $X^0$, $X^-$, and LES contributions as a function of 1000-s laser irradiation, in 40% relative humidity and 80% relative humidity, respectively. Note RH=relative humidity, which represents the amount of $H_2O$ vapor in dry air.
Figure 9B:
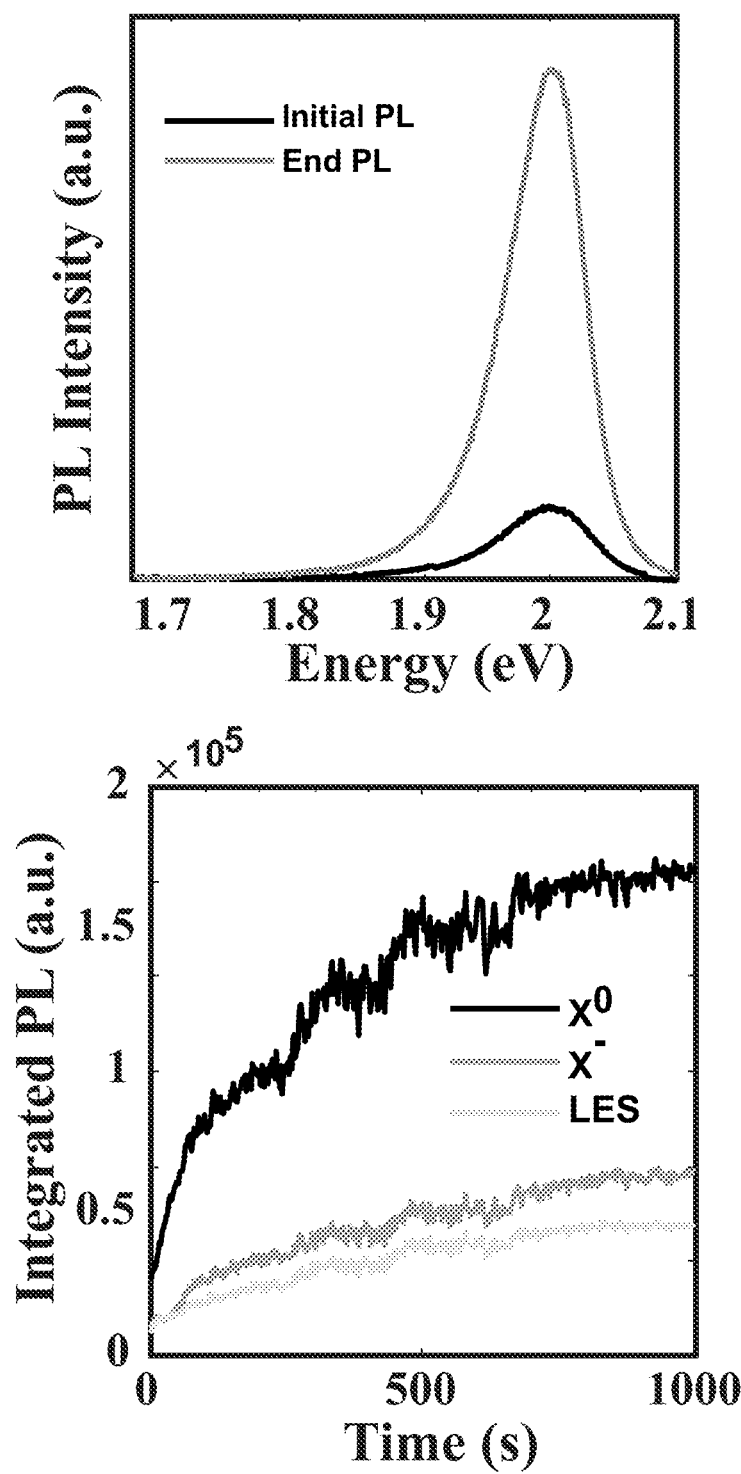

Relative Humidity Sensing. $WS_2$ interacting with $O_2$ or $H_2O$ under continuous laser exposure have distinct radiative pathways. Thus, it may be expected that the PL will vary under different relative humidity conditions when exposed to 1000 s of continuous 532-nm laser illumination, where the relative humidity is the amount of $H_2O$ in dry air. Therefore, 40% and 80% relative humidity were evaluated. At 40% relative humidity (see the top panel of FIG. 9A), the $WS_2$ PL change after 1000 s of continuous 532-nm laser illumination was characteristic of $WS_2$ exposed to the $O_2$ environment, where there was an overall PL redshift in addition to a PL increase. The deconvoluted PL as a function of time shows that the $X^-$ emission was dominating the PL increase (see the bottom panel of FIG. 9A). In the 80% relative humidity environment shown in the top panel of FIG. 9B, the $WS_2$ PL increased in intensity with minimal shifting, which followed the trend of the $H_2O$ environment only. As seen from the bottom panel of FIG. 9B, the $X^0$ emission (~52% at t=1000 s from ~60% at t=0) governs the overall quantum yield increase. In summary, $WS_2$ PL changed in the 40% and 80% relative humidity environment are very distinguishable, providing a unique way to quantify the relative humidity.

Methods:

Sample Preparation. Monolayer $WS_2$ was grown on $SiO_2$/Si wafers by atmospheric pressure CVD (APCVD), following the procedures from a previous report. For synthesizing monolayer $WS_2$, a water-soluble precursor was coated on the $SiO_2$/Si substrate first. The precursor solution was prepared by mixing three types of chemical solutions. 0.2 g of ammonium metatungstate (AMT, Sigma-Aldrich, 463922) was dissolved in 10 mL of deionized (DI) water for tungsten precursor. 0.1 g of sodium hydroxide (NaOH, Sigma-Aldrich, 795429) dissolved in 30 mL DI water was introduced for promoting monolayer TMDCs. An OptiPrep density gradient medium (Sigma-Aldrich, D1556, 60% (w/v) solution of iodixanol in water) was used as a medium solution. The mixed precursor solutions were coated onto the $SiO_2$/Si wafer by spin-casting at 3000 rpm for 1 min. The precursor-coated substrate and 0.2 g of sulfur (Sigma-Aldrich, 344621) were separately placed into a two-zone furnace. The temperature of the sulfur zone was increased to 220° C. at a rate of 25° C./min while the substrate zone was increased to 800° C. at a rate of 100° C./min. 600 sccm of $N_2$ and 10 sccm of $H_2$ gas were injected as a carrier gas and reactive agent, respectively, to reduce metal oxides. The as-grown $WS_2$ on $SiO_2$/Si was transferred to quartz substrate for further experiments. Poly(methyl methacrylate) (PMMA C4, MicroChem) was coated onto samples as a supporting layer and then immersed into diluted hydrofluoric acid for detaching $WS_2$ from the $SiO_2$/Si wafer by etching silicon oxide. The PMMA-supported samples were transferred to the quartz substrates and then PMMA was removed by acetone.

After growth via CVD, all the $WS_2$ monolayers were annealed at 300° C. in $N_2$ for 60 min to desorb any potential physisorbed molecules. To generate an $O_2$ rich environment, in-house dry air (~22 vol. % $O_2$ in $N_2$) was used to purge a glove bag for 3 h. The humid condition was created by circulating house $N_2$ through ultra-pure water (18.2 MΩ) prior to purging the glove bag for 24 h, resulting in a $H_2O$ vapor saturated environment. Inert gas ($N_2$ only), dry air ($O_2$ in $N_2$, no moisture), and humid $N_2$ ($H_2O$ vapor in $N_2$, no $O_2$) environments were at atmospheric pressure (~640 Torr). The 40% and 80% relative humidity environments for the PL humidity detecting experiments were created by a humidifier with controlled dry airflow in the glove bag. A sealed-sample holder (diameter x height: 50 mm×7 mm) containing two glass windows and one quad-ring was designed, which was robust enough to maintain the preferred environment for the duration of the measurements (24 h). For the TRMC measurements, the $WS_2$ in $O_2$ and $H_2O$ were prepared by illuminating with 532-nm LED lamp (~150 mW) in dry air or humid $N_2$, respectively, for 12 h before TRMC measurements.

Confocal Photoluminescence and Raman. Confocal PL and Raman spectra of $WS_2$ monolayer were acquired with an InVia Renishaw confocal Raman microscope with a 532-nm laser. A long working distance 50× objective lens (Olympus SLMPLN 50× Objective) with a numerical aperture of 0.35 was used. The estimated laser-focused spot area was about 2.7 $\mu m^2$. The 532-nm laser spot size was about 1 μm. A Thorlabs PM100D Power Meter measured the laser power. For the PL measurements, the laser intensities were between 6.5 μW and 12.9 mW with 2 s integration time and 5 accumulations. For the Raman measurements, the laser intensity was 889 μW. The sample reflected signal was dispersed (600 lines/mm grating for the PL measurements and 1800 lines/mm grating for the Raman measurements) and detected by a charge-coupled device (CCD) array. The in-situ PL scan was collected every 1 second with a continuous laser exposure. The samples were fixed on a motorized stage. To minimize the light exposure on the $WS_2$ samples, the data were collected with 1-μm step sizes.

Time-resolved Microwave Conductivity. TRMC was used to measure the photoconductivity of the monolayer $WS_2$ reported herein. Briefly, the measurement consisted of monitoring the absorption of a 9 GHz continuous-wave microwave probe following photoexcitation of the sample with a few-nanosecond laser pulse. The measured microwave absorption was used to calculate the real part of the photoconductivity, which could, in turn, be expressed as the product of photoinduced charge carrier yield ($\phi$) and the sum of the electron and hole mobilities ($\Sigma\mu$). The time resolution of the experiment, as configured here, was ~1 ns after de-convolution of the instrument response function. All experiments reported herein were carried out in a sealed microwave cavity (K=24000), actively purged with dry $N_2$.

The foregoing discussion and examples have been presented for purposes of illustration and description. The foregoing is not intended to limit the aspects, embodiments, or configurations to the form or forms disclosed herein. In the foregoing Detailed Description for example, various features of the aspects, embodiments, or configurations are grouped together in one or more embodiments, configurations, or aspects for the purpose of streamlining the disclosure. The features of the aspects, embodiments, or configurations may be combined in alternate aspects, embodiments, or configurations other than those discussed above. This method of disclosure is not to be interpreted as reflecting an intention that the aspects, embodiments, or configurations require more features than are expressly recited in each claim. Rather, as the following claims reflect, inventive aspects lie in less than all features of a single foregoing disclosed embodiment, configuration, or aspect. While certain aspects of conventional technology have been discussed to facilitate disclosure of some embodiments of the present invention, the Applicants in no way disclaim these technical aspects, and it is contemplated that the claimed invention may encompass one or more of the conventional technical aspects discussed herein. Thus, the following claims are hereby incorporated into this Detailed Description, with each claim standing on its own as a separate aspect, embodiment, or configuration.

What is claimed is:

1. A device comprising:
    a light source;
    a detector; and
    a film having a first surface comprising a transition metal dichalcogenide, wherein:
    the film is configured to interact with a volume of gas containing a concentration of water vapor,
    the light source is configured to shine a first light onto the first surface,
    the film is configured, as a result of the first light, to emit from the first surface a second light,
    the detector is configured to receive at least a portion of the second light, and
    the detector is configured to generate a signal proportional to an intensity of the second light such that the intensity correlates to the concentration of water vapor.

2. The device of claim 1, wherein the light source comprises at least one of a light-emitting diode or a laser.

3. The device of claim 1, wherein the first light comprises a wavelength between about 400 nm and about 650 nm.

4. The device of claim 1, wherein the first light comprises a wavelength between about 515 nm and about 545 nm.

5. The device of claim 1, wherein the light source is configured to provide a power between about 0.1 μW and about 10,000 μW.

6. The device of claim 1, wherein the second light comprises a wavelength between about 400 nm and about 1050 nm.

7. The device of claim 1, wherein the detector is configured to detect visible light.

8. The device of claim 7, wherein the detector comprises a silicon charge-coupled device.

9. The device of claim 1, wherein the film has a thickness between about 0.1 nm and about 10.0 nm.

10. The device of claim 1, wherein the transition metal dichalcogenide comprises tungsten disulfide.

11. The device of claim 10, wherein the transition metal dichalcogenide comprises at least one of tungsten disulfide, tungsten diselenide, tungsten ditelluride, molybdenum disulfide, hafnium disulfide, iridium disulfide, manganese diselenide, molybdenum diselenide, molybdenum ditelluride, niobium diselenide, niobium disulfide, platinum diselenide, platinum disulfide, rhenium diselenide, rhenium disulfide, rhenium ditelluride, zirconium disulfide, titanium(IV) sulfide, titanium disulfide, tungsten diselenide, tungsten ditelluride, hafnium diselenide, vanadium disulfide, or vanadium diselenide.

12. A system comprising:
a processor; and
a device comprising:
 a light source;
 a detector; and
 a film having a first surface comprising a transition metal dichalcogenide, wherein:
the film is configured to interact with a volume of gas containing a concentration of water vapor,
the light source is configured to shine a first light onto the first surface,
the film is configured, as a result of the first light, to emit from the first surface a second light,
the detector is configured to receive at least a portion of the second light,
the detector is configured to generate a signal proportional to an intensity of the second light,
the processor is configured to receive the signal,
the processor comprises an algorithm that converts the signal to a variable that is proportional to the concentration of water vapor, and
the algorithm comprises a plot of relative humidity versus an integrated area of at least one of a photoluminescence intensity of an exciton ($X^0$), a photoluminescence intensity of a trion ($X^-$), or a photoluminescence intensity lower energy state (LES).

13. The system of claim 12, wherein the signal comprises a power intensity of the second light.

14. The system of claim 12, wherein the variable comprises an integrated area of at least one of a photoluminescence intensity of an exciton($X^0$), a photoluminescence intensity of a trion ($X^-$), or a photoluminescence intensity lower energy state (LES).

15. A method comprising:
exposing a film having a surface comprising a transition metal dichalcogenide to a volume of gas containing a concentration of water vapor;
directing a first light to the surface, resulting in the forming of a second light by the surface photoluminescing, wherein the second light comprises at least two wavelengths;
during the directing, measuring the intensity of each wavelength;
calculating from the spectral area, at least one Gaussian component; and
correlating the Gaussian component to the concentration of water vapor.

16. The method of claim 15, wherein the Gaussian component comprises at least one of a photoluminescence intensity of an exciton($X^0$), a photoluminescence intensity of a trion ($X^-$), or a photoluminescence intensity lower energy state (LES).

17. The method of claim 16, wherein the correlating comprises creating a calibration plot of a relative humidity versus an integrated area of at least one of a photoluminescence intensity of an exciton($X^0$), a photoluminescence intensity of a trion ($X^-$), or a photoluminescence intensity lower energy state (LES).

18. The method of claim 17, wherein the integrated area is completed for a time period between 1 second and 1000 seconds.

19. The method of claim 15, further comprising an annealing of the film in an inert atmosphere at a temperature between about 100° C. and about 300° C.

* * * * *